United States Patent
Shirotori et al.

(10) Patent No.: US 12,550,257 B2
(45) Date of Patent: Feb. 10, 2026

(54) WIRING SUBSTRATE

(71) Applicant: SHINKO ELECTRIC INDUSTRIES CO., LTD., Nagano (JP)

(72) Inventors: Toshiki Shirotori, Nagano (JP); Ryota Hoshina, Nagano (JP); Kenta Nakamura, Nagano (JP)

(73) Assignee: SHINKO ELECTRIC INDUSTRIES, CO., LTD., Nagano (JP)

( * ) Notice: Subject to any disclaimer, the term of this patent is extended or adjusted under 35 U.S.C. 154(b) by 191 days.

(21) Appl. No.: 18/499,415

(22) Filed: Nov. 1, 2023

(65) Prior Publication Data
US 2024/0179839 A1    May 30, 2024

(30) Foreign Application Priority Data
Nov. 24, 2022 (JP) .................... 2022-187513

(51) Int. Cl.
*H05K 1/11* (2006.01)
(52) U.S. Cl.
CPC .................... *H05K 1/116* (2013.01)
(58) Field of Classification Search
CPC ...... H05K 1/116; H05K 3/421; H05K 3/4661; H05K 1/112; H05K 1/115; H05K 3/42; H05K 2201/0979; H05K 2201/09627; H05K 2201/09745

USPC .......................................... 174/262
See application file for complete search history.

(56) References Cited

U.S. PATENT DOCUMENTS

| 2015/0163919 A1* | 6/2015 | Nakagome | ............. H01L 23/13 |
| | | | 174/255 |
| 2024/0304554 A1* | 9/2024 | Kim | .................... H01L 23/5283 |

FOREIGN PATENT DOCUMENTS

JP    2021168348 A    10/2021

* cited by examiner

*Primary Examiner* — Timothy J Thompson
*Assistant Examiner* — Sidi M Maiga
(74) *Attorney, Agent, or Firm* — Tarolli, Sundheim, Covell & Tummino LLP

(57) ABSTRACT

A wiring substrate includes a first wiring layer, an insulation layer covering the first wiring layer, a first through hole extending through the insulation layer and exposing part of the upper surface of the first wiring layer, and a second through hole arranged adjacent to the first through hole. The second through hole extends through the insulation layer in the thickness-wise direction and exposes part of the upper surface of the first wiring layer. A bottom portion of the first through hole is in communication with a bottom portion of the second through hole through a communication hole. A via wiring fills the first through hole, the second through hole, and the communication hole. A second wiring layer is formed integrally with the via wiring on the insulation layer.

12 Claims, 17 Drawing Sheets

WIRING SUBSTRATE

CROSS-REFERENCE TO RELATED APPLICATIONS

This application is based upon and claims the benefit of priority from prior Japanese Patent Application No. 2022-187513, filed on Nov. 24, 2022, the entire contents of which are incorporated herein by reference.

FIELD

This disclosure relates to a wiring substrate and a method for manufacturing a wiring substrate.

BACKGROUND

Wiring substrates for mounting electronic components, such as semiconductor elements, come in various shapes and configurations. Japanese Laid-Open Patent Publication No. 2021-168348 describes a wiring substrate formed in a build-up process that alternately stacks wiring layers and insulation layers. The wiring layers are electrically connected to one another by via wirings formed in through holes that extend through the insulation layers.

SUMMARY

When a reliability test or the like is conducted, the application of heat to the wiring substrate may produce cracks in an interface of the via wirings and the wiring layers. Cracks in the interface of the via wirings and the wiring layers will lower the reliability of the electrical connection between the via wirings and the wiring layers.

An embodiment of a wiring substrate includes a first wiring layer, an insulation layer covering an upper surface of the first wiring layer, a first through hole extending through the insulation layer in a thickness-wise direction and exposing part of the upper surface of the first wiring layer, and a second through hole located adjacent to the first through hole. The second through hole extends through the insulation layer in the thickness-wise direction and exposes part of the upper surface of the first wiring layer. A bottom portion of the first through hole is in communication with a bottom portion of the second through hole through a communication hole. A via wiring fills the first through hole, the second through hole, and the communication hole. A second wiring layer is formed integrally with the via wiring on an upper surface of the insulation layer.

Other features and aspects will be apparent from the following description, the drawings, and the claims.

BRIEF DESCRIPTION OF DRAWINGS

The embodiments, together with objects and advantages thereof, may best be understood by reference to the following description of the presently preferred embodiments together with the accompanying drawings in which.

DETAILED DESCRIPTION

Figure 1:
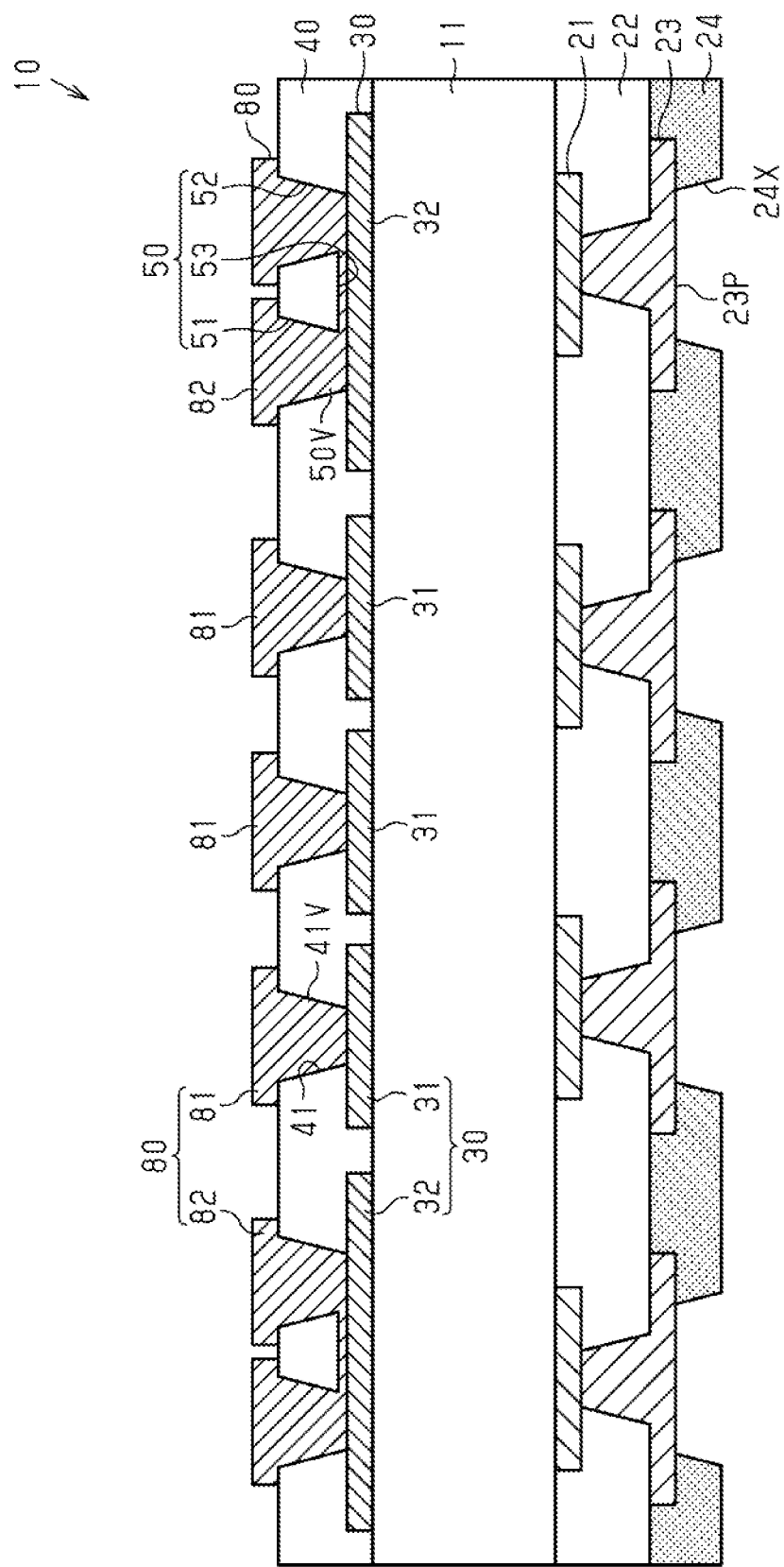
FIG. 1 is a schematic cross-sectional view illustrating one embodiment of a wiring substrate.

Embodiments will now be described with reference to the drawings.

In the accompanying drawings, elements are illustrated for simplicity and clarity and have not necessarily been drawn to scale. To facilitate understanding, hatching lines may not be illustrated or be replaced by shadings in the cross-sectional views. In this specification, a plan view refers to a view taken in a vertical direction (e.g., vertical direction as viewed in FIG. 1), and a planar shape refers to a shape of a subject as viewed in the vertical direction. Further, in this specification, the orientation of the reference characters denoting members will define the upward, downward, leftward, and rightward directions. Also, in this specification, the terms of parallel, perpendicular, and orthogonal are not meant to be strictly parallel, perpendicular, and orthogonal and include generally parallel, perpendicular, and orthogonal states in a range allowing the advantages of the present embodiment to be obtained. In this specification, "equal" will not only cover a state in which the compared subjects are exactly equal but also cover a state in which there is a slight difference, resulting from dimensional tolerances or the like, between the compared subjects.

Structure of Wiring Substrate 10

The structure of the wiring substrate 10 will now be described with reference to FIG. 1.

With reference to FIG. 1, the wiring substrate 10 includes, for example, a substrate body 11. A wiring layer 21, an insulation layer 22, a wiring layer 23, and a solder resist layer 24 are sequentially formed on a lower surface of the substrate body 11. A wiring layer 30, an insulation layer 40, and a wiring layer 80 are sequentially formed on an upper surface of the substrate body 11.

A wiring structure of alternately stacked insulative resin layers and wiring layers may be used as the main substrate body 11. The wiring structure may include, for example, a core substrate but does not have to. The material of the insulative resin layers may be, for example, an insulative thermosetting resin. The insulative thermosetting resin may be, for example, an insulative resin such as an epoxy resin, a polyimide resin, or a cyanate resin. The material of the insulative resin layers may also be, for example, an insulative resin of which the main component is a photosensitive resin such as a phenolic resin or a polyimide resin. The insulative resin layers may include, for example, a filler of silica or alumina.

The wiring layers 21, 23, and 30 and wiring layers of the substrate body 11 may be formed from, for example, copper (Cu) or a copper alloy. The insulation layers 22 and 40 may be formed from, for example, an insulative thermosetting resin. The insulative thermosetting resin may be, for example, an insulative resin such as an epoxy resin, a polyimide resin, or a cyanate resin.

The wiring layer 21 is formed on the lower surface of the substrate body 11. The insulation layer 22, which covers the wiring layer 21, is formed on the lower surface of the substrate body 11. The wiring layer 23 is formed on the lower surface of the insulation layer 22. The wiring layer 23, for example is, formed integrally with wiring vias extending through the insulation layer 22 in the thickness-wise direction, and is electrically connected to the wiring layer 21.

The solder resist layer 24, which covers the wiring layer 23, is formed on the lower surface of the insulation layer 22. The material of the solder resist layer 24 may be, for example, an insulative resin of which the main component is a photosensitive resin such as a phenolic resin or a polyimide resin. The solder resist layer 24 may include, for example, a filler of silica or alumina. The material of the solder resist layer 24 is not limited to an insulative resin of which the main component is a photosensitive insulative resin and may be, for example, the same insulative material as the insulation layer 22. The solder resist layer 24 includes openings 24X exposing parts of the lower surface of the wiring layer 23 as external connection pads 23P. The external connection pads 23P are used to mount the wiring substrate 10 on a mounting substrate such as a motherboard.

A surface-processed layer is formed on the lower surface of the wiring layer 23 exposed at the bottom portions of the openings 24X. Examples of the surface-processed layer includes a gold (Au) layer, a nickel (Ni) layer/Au layer (metal layer in which Ni layer serves as bottom layer, and Au layer is formed on Ni layer), Ni layer/palladium (Pd) layer/Au layer (metal layer in which Ni layer serves as bottom layer, and Ni layer and Pd layer are formed in order on Au layer). An Au layer is a metal layer formed from Au or an Au alloy, an Ni layer is a metal layer formed from Ni or an Ni alloy, and a Pd layer is a metal layer formed from Pd or a Pd alloy. The Ni layer, the Au layer, and the Pd layer may each be, for example, a metal layer formed through an electroless plating process, that is, an electroless plating layer. Alternatively, the surface-processed layer may be, for example, an organic solderability preservative (OSP) film formed by performing an oxidation-resisting process on the surfaces of the external connection pads 23P. The OSP film may be an organic coating of an azole compound or an imidazole compound. When a surface-processed layer is formed on the lower surface of the wiring layer 23, the surface-processed layer will function as the external connection pads 23P. The wiring layer 23 exposed at the bottom portions of the openings 24X (or the surface-processed layer when formed on the wiring layer 23) may be used as the external connection terminals.

The wiring layer 30 is formed on the upper surface of the substrate body 11. The wiring layer 30 is electrically connected to the wiring layer 21 by, for example, wiring layers and through-electrodes formed in the substrate body 11. The wiring layer 30 may have a thickness of, for example, 5 μm to 20 μm.

The wiring layer 30 includes, for example, a wiring layer 31 and a wiring layer 32. The wiring layer 31 is, for example, signal wiring. The wiring layer 32 is, for example, a planar layer. The planar layer may include, for example, a power plane and a GND plane.

The wiring layer 32 is, for example, a solid plane. For example, the wiring layer 32 is larger than the wiring layer 31 in plan view. The wiring layer 32 is, for example, located toward the outer side of the wiring substrate 10 from the wiring layer 31.

The insulation layer 40 is formed on the upper surface of the substrate body 11 so as to cover the upper surface of the wiring layer 30. The insulation layer 40 covers the side surfaces of the wiring layer 30. The insulation layer 40 has a thickness from the upper surface of the wiring layer 30 to the upper surface of the insulation layer 40 of, for example, approximately 10 μm to 30 μm.

The insulation layer 40 includes through holes 41 extending through the insulation layer 40 in the thickness-wise direction and exposing parts of the upper surface of the wiring layer 31. The through holes 41 may each have any shape and size in plan view. The through holes 41 of the present example are circular in plan view. The through holes 41 have a depth of, for example, approximately 10 μm to 30 μm. The through holes 41 are each, for example, tapered so that its width (diameter) decreases downward from the upper side (upper surface of the insulation layer 40) as illustrated in FIG. 1.

The insulation layer 40 includes through holes 50 extending through the insulation layer 40 in the thickness-wise direction and exposing parts of the upper surface of the wiring layer 32. Each through hole 50 includes a first through hole 51, a second through hole 52 located adjacent to the first through hole 51, and a communication hole 53 through which a bottom portion of the first through hole 51 is in communication with the bottom portion of the second through hole 52. The first through hole 51 extends through the insulation layer 40 in the thickness-wise direction and exposes part of the upper surface of the wiring layer 32. The second through hole 52 extends through the insulation layer 40 in the thickness-wise direction and exposes part of the upper surface of the wiring layer 32. The first through hole 51 and the second through hole 52 may each have any shape and size in plan view. For example, the first through hole 51 and the second through hole 52 are each circular in plan view. The first through hole 51 and the second through hole 52 may each have a depth of, for example, approximately 10 μm to 30 μm. The first through hole 51 and the second through hole 52 are each tapered so that its width (diameter) decreases downward from the upper side (upper surface of the insulation layer 40) as illustrated in FIG. 1.

The wiring layer 80 is formed on the upper surface of the insulation layer 40. The wiring layer 80 is the outermost wiring layer (uppermost wiring layer) of the wiring substrate 10. The wiring layer 80 has a thickness of, for example, approximately 5 μm to 20 μm.

The wiring layer 80 includes, for example, a wiring layer 81 and a wiring layer 82. The wiring layer 81 functions as a connection pad used to, for example, connect an electronic component such as a semiconductor element.

The wiring layer 81 is electrically connected to the wiring layer 31 by, for example, via wirings 41V formed in the through holes 41 of the insulation layer 40. The wiring layer 81 is, for example, formed continuously and integrally with the via wirings 41V. For example, the through holes 41 are filled with the via wirings 41V. The via wirings 41V may each have a thickness of, for example, approximately 10 μm to 30 μm.

The wiring layer 82 is electrically connected to the wiring layer 32 by, for example, a via wiring 50V formed in each through hole 50 of the insulation layer 40. The wiring layer 82 is, for example, formed continuously and integrally with the via wiring 50V. For example, each through hole 50 is filled with the via wiring 50V. For example, the first through hole 51, the second through hole 52, and the communication hole 53 are filled with the via wiring 50V. The via wiring 50V has a thickness of, for example, approximately 10 μm to 30 μm.

Figure 2:
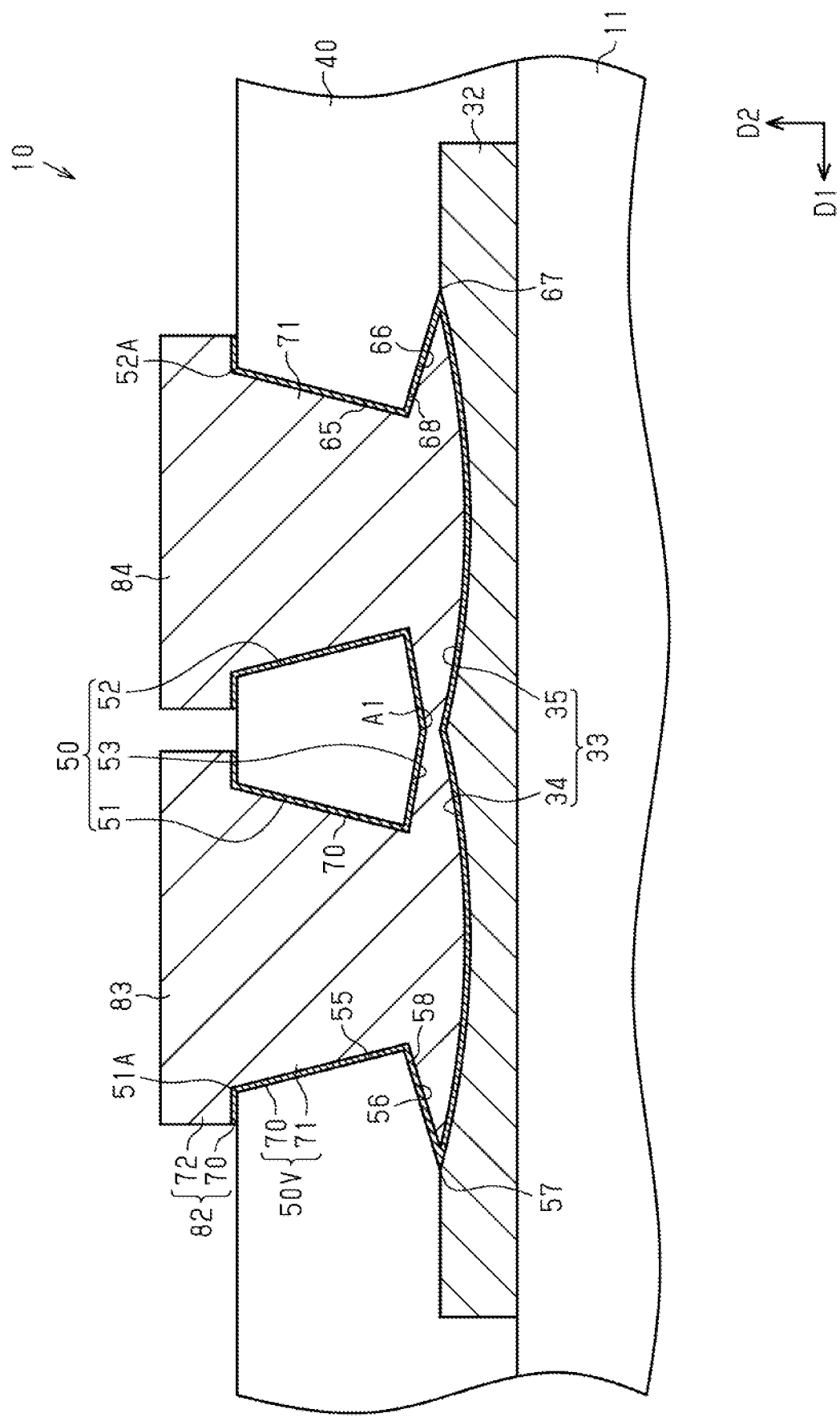
FIG. 2 is a schematic cross-sectional view illustrating, in an enlarged manner, part of the wiring substrate of FIG. 1.
Figure 3:
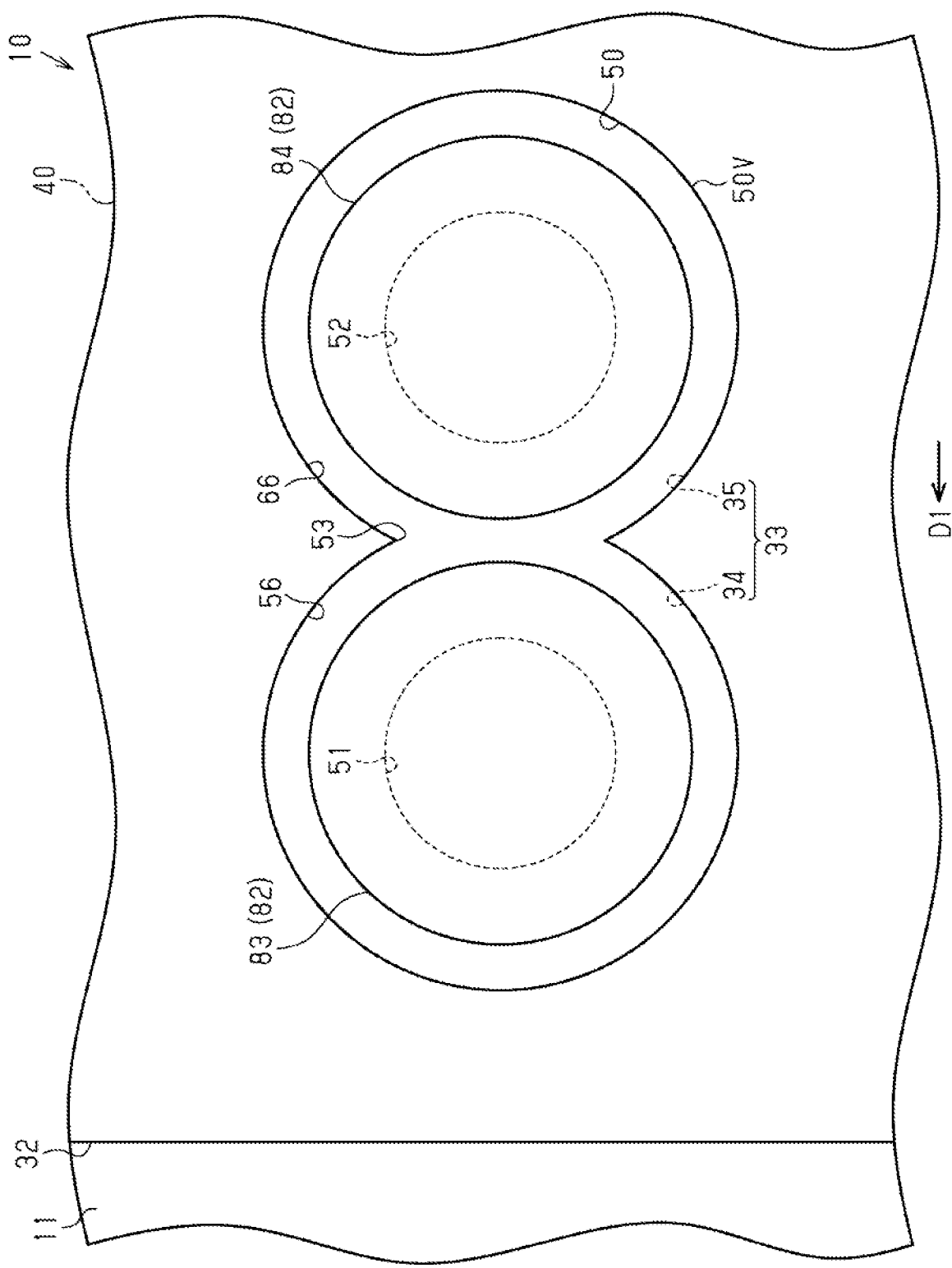
FIG. 3 is a schematic plan view of the wiring substrate illustrated in FIG. 2.

With reference to FIGS. 2 and 3, the structures of the wiring layer 32, the insulation layer 40, the through holes 50, the via wiring 50V, and the wiring layer 82 will now be described. FIG. 3 is a plan view of the wiring substrate 10 illustrated in FIG. 2 as seen through the insulation layer 40.

With reference to FIG. 2, the wiring layer 32 includes a recessed portion 33 recessed downward from the upper surface of the wiring layer 32 (toward substrate body 11). The recessed portion 33 may have any shape and size in plan view.

The recessed portion 33 is, for example, in communication with the through hole 50. The recessed portion 33 is, for example, in communication with the first through hole 51 and the second through hole 52. The recessed portion 33 is, for example, in communication with the communication hole 53. The recessed portion 33, for example, extends from the upper surface of the wiring layer 32 to an intermediate position of the wiring layer 32 in the thickness-wise direction. The recessed portion 33 includes a bottom surface in the thickness-wise direction defined by the wiring layer 32. Thus, the recessed portion 33 does not extend through the wiring layer 32 in the thickness-wise direction. The recessed portion 33, for example, entirely overlaps the through hole 50 in plan view. The recessed portion 33 extends in, for example, the planar direction of the wiring layer 32 (i.e., direction orthogonal to thickness-wise direction of wiring layer 32 in cross-sectional view).

The recessed portion 33 includes, for example, a first recessed portion 34 and a second recessed portion 35. The first recessed portion 34 and the second recessed portion 35 are continuous with each other in a first direction D1 (sideward direction in FIG. 2) in which the first through hole 51 and the second through hole 52 are arranged next to each other.

The first recessed portion 34 is, for example, where the upper surface of the wiring layer 32 is exposed by the first through hole 51. The first recessed portion 34 is in direct communication with, for example, the first through hole 51. The first recessed portion 34, for example, overlaps the first through hole 51 in plan view. With reference to FIG. 3, the first recessed portion 34 in plan view is, for example, similar in shape to the first through hole 51. The first recessed portion 34 as a whole is, for example, circular in plan view. The first recessed portion 34 is, for example, shaped to be concentric with the first through hole 51 in plan view.

With reference to FIG. 2, the second recessed portion 35 is, for example, where the upper surface of the wiring layer 32 is exposed by the second through hole 52. The second recessed portion 35 is in direction communication with, for example, the second through hole 52. The second recessed portion 35, for example, overlaps the second through hole 52 in plan view. With reference to FIG. 3, the second recessed portion 35 in plan view is, for example, similar in shape to the second through hole 52. The second recessed portion 35 as a whole, is, for example, circular in plan view. The second recessed portion 35 is, for example, shaped to be concentric with the second through hole 52 in plan view.

The recessed portion 33 is formed so that, for example, part of the first recessed portion 34 in the circumferential direction is connected to part of the second recessed portion 35 in the circumferential direction in plan view. The recessed portion 33 has the shape of two circles partially overlapping each other in the circumferential direction in plan view.

With reference to FIG. 2, the first recessed portion 34 and the second recessed portion 35 each have, for example, a semicircular or semielliptical cross section. The first recessed portion 34 and the second recessed portion 35 each have, for example, a curved surface that is a circular arc or an elliptical arc in cross section. The surface defining the first recessed portion 34 is curved downward from the outer edge of the first recessed portion 34 toward the center of the first through hole 51 in plan view. The surface defining the second recessed portion 35 is curved downward from the other edge of the second recessed portion 35 toward the center of the second through hole 52 in plan view. In the example of FIG. 2, the surface defining the recessed portion 33 is shaped, in cross section, by the semielliptical arc of the first recessed portion 34 and the semielliptical arc of the second recessed portion 35 that are continuous in the planar direction. The recessed portion 33 has a depth of, for example, approximately 1 μm to 5 μm.

Exemplary Structure of First Through Hole 51

The first through hole 51 includes a step in a depth-wise direction. In the example of FIG. 2, the first through hole 51 includes a step located at the bottom portion of the first through hole 51. The first through hole 51 includes a first wall 55 extending downward from the upper surface of the insulation layer 40 and a first depression 56 extending toward an outer side of the first through hole 51 from the first wall 55. The first wall 55 and the first depression 56 form the step in the bottom portion of the first through hole 51.

The first wall 55 of the first through hole 51, for example, extends downward from an upper open end 51A (upper end) of the first through hole 51 to the first depression 56. The first wall 55 is, for example, inclined downwardly from the open end 51A into the first through hole 51 (i.e., toward center of first through hole 51 in plan view). The first wall 55 does not have to be straight. The first wall 55 may be partially or entirely curved so as to be convex or concave. In the example of FIG. 2, the first wall 55 is inclined and extends straight without any steps in a cross-sectional view.

The first depression 56 is continuous with the lower end of the first wall 55. The first depression 56 increases the width (diameter in example of FIG. 2) of the bottom portion of the first through hole 51. In the example of FIG. 2, the first depression 56 further increases the width (diameter) of the first through hole 51 at the lower end of the first wall 55. With reference to FIG. 3, the first depression 56 is, for example, formed continuously over the entirety of the first through hole 51 in the circumferential direction. The first depression 56 increases the width of the bottom portion of the first through hole 51 over the entirety of the first through hole 51 in the circumferential direction. The first depression 56, for example, overlaps the first recessed portion 34 in plan view.

With reference to FIG. 2, the first depression 56 includes a first outer end 57, which corresponds to the bottom of the first depression 56, and a first surface 58, which extends from the lower end of the first wall 55 to the first outer end 57. The first outer end 57 is the part of the first depression 56 that is the farthest from the first wall 55 in plan view. The first outer end 57 is connected to, for example, the open end of the first recessed portion 34. The first surface 58 is, for example, inclined downward from the lower end of the first wall 55 toward the outer side of the first through hole 51 (i.e., away from center of first through hole 51 in plan view). The first surface 58 does not have to be straight. The first surface 58 may be partially or entirely curved so as to be convex or concave. In the example of FIG. 2, the first surface 58 is inclined and extends straight without any steps in a cross-sectional view.

The width of the first through hole 51 at the lower end of the first depression 56 is greater than the width of the first through hole 51 at the lower end of the first wall 55. The width of the first through hole 51 at the lower end of the first depression 56 is set to be, for example, greater than or equal to the width of the first through hole 51 at the open end 51A. For example, the width of the first through hole 51 at the first outer end 57 is set to be greater than or equal to the width of the first through hole 51 at the open end 51A. In the example of FIG. 2, the width of the first through hole 51 at the first outer end 57 is greater than the width of the first through hole 51 at the open end 51A. Thus, the first outer end 57 is located further outward from the open end 51A in plan view, that is, further inward into the insulation layer 40 from the open end 51A in plan view.

The width of the first through hole 51 at the open end 51A is, for example, approximately 50 μm to 100 μm. The width of the first through hole 51 at the lower end of the first wall 55 is, for example, approximately 30 μm to 80 μm. The width of the first through hole 51 at the first outer end 57 of the first depression 56 is, for example, approximately 50 μm to 150 μm.

Exemplary Structure of Second Through Hole 52

The second through hole 52 includes a step in a depthwise direction. In the example of FIG. 2, the second through hole 52 includes a step located at the bottom portion of the second through hole 52. The second through hole 52 includes a second wall 65 extending downward from the upper surface of the insulation layer 40 and a second depression 66 extending toward an outer side of the second through hole 52 from the second wall 65. The second wall 65 and the second depression 66 form the step in the bottom portion of the second through hole 52.

The second wall 65 of the second through hole 52, for example, extends downward from an upper open end 52A (upper end) of the second through hole 52 to the second depression 66. The second wall 65 is, for example, inclined downwardly from the open end 52A into the second through hole 52 (i.e., toward center of second through hole 52 in plan view). The second wall 65 does not have to be straight. The second wall 65 may be partially or entirely curved so as to be convex or concave. In the example of FIG. 2, the second wall 65 is inclined and extends straight without any steps in a cross-sectional view.

The second depression 66 is continuous with the lower end of the second wall 65. The second depression 66 increases the width (diameter in example of FIG. 2) of the bottom portion of the second through hole 52. In the example of FIG. 2, the second depression 66 further increases the width (diameter) of the second through hole 52 at the lower end of the second wall 65. With reference to FIG. 3, the second depression 66 is, for example, formed continuously over the entirety of the second through hole 52 in the circumferential direction. The second depression 66 increases the width of the bottom portion of the second through hole 52 over the entirety of the second through hole 52 in the circumferential direction. The second depression 66, for example, overlaps the second recessed portion 35 in plan view.

With reference to FIG. 2, the second depression 66 includes a second outer end 67, which corresponds to the bottom of the second depression 66, and a second surface 68, which extends from the lower end of the second wall 65 to the second outer end 67. The second outer end 67 is the part of the second depression 66 that is the farthest from the second wall 65 in plan view. The second outer end 67 is connected to, for example, the open end of the second recessed portion 35. The second surface 68 is, for example, inclined downward from the lower end of the second wall 65 toward the outer side of the second through hole 52 (i.e., away from center of second through hole 52 in plan view). The second surface 68 does not have to be straight. The second surface 68 may be partially or entirely curved so as to be convex or concave. In the example of FIG. 2, the second surface 68 is inclined and extends straight without any steps in a cross-sectional view.

The width of the second through hole 52 at the lower end of the second depression 66 is greater than the width of the second through hole 52 at the lower end of the second wall 65. The width of the second through hole 52 at the lower end of the second depression 66 is set to be, for example, greater than or equal to the width of the second through hole 52 at the open end 52A. The width of the second through hole 52 at the second outer end 67 is set to be, for example, greater than or equal to the width of the second through hole 52 at the open end 52A. In the example of FIG. 2, the width of the second through hole 52 at the second outer end 67 is greater than the width of the second through hole 52 at the open end 52A. Thus, the second outer end 67 is located further outward from the open end 52A in plan view, that is, further inward into the insulation layer 40 from the open end 52A in plan view.

The width of the second through hole 52 at the open end 52A is, for example, approximately 50 μm to 100 μm. The width of the second through hole 52 at the second wall 65 is, for example, approximately 30 μm to 80 μm. The width of the second through hole 52 at the second outer end 67 of the second depression 66 is, for example, approximately 50 μm to 150 μm.

Exemplary Structure of Communication Hole 53

The bottom portion of the first through hole 51 is in communication with the bottom portion of the second through hole 52 through the communication hole 53. The communication hole 53 increases the width of the first through hole 51 at the bottom portion of the first through hole 51 and increases the width of the second through hole 52 at the bottom portion of the second through hole 52. For example, part of the first depression 56 is in communication with part of the second depression 66 through the communication hole 53. Thus, the communication hole 53 includes part of the first depression 56 and part of the second depression 66. With reference to FIG. 3, part of the first depression 56 in the circumferential direction is in communication with part of the second depression 66 in the circumferential direction through the communication hole 53.

With reference to FIG. 2, the communication hole 53 extends from the first wall 55 of the first through hole 51 to the second wall 65 of the second through hole 52 in the first direction D1 (sideward direction in FIG. 2) in which the first through hole 51 and the second through hole 52 are arranged next to each other. The communication hole 53 extends through a lower portion of the insulation layer 40 between the first through hole 51 and the second through hole 52 in the first direction D1. Thus, the first through hole 51, the second through hole 52, and the communication hole 53 form a via hole having a U-shaped cross section. In this disclosure, a U-shaped cross section covers the shape illustrated in FIG. 2 in which the first through hole 51 includes the first depression 56 and the second through hole 52 includes the second depression 66. The communication hole 53 has, for example, a depth in a second direction D2 that is orthogonal to the first direction D1. The depth of the communication hole 53 is, for example, at a minimum at a middle position in the first direction D1 of the communication hole 53. The middle position defines a narrowest portion A1. For example, the depth of the communication hole 53 increases from the middle position of the communication hole 53 in the first direction D1 (i.e., narrowest portion A1)

toward the two opposite open ends of the communication hole 53. Thus, the depth of the communication hole 53 increases from the narrowest portion A1 toward the first through hole 51 (lower end of first wall 55 in example of FIG. 2), and from the narrowest portion A1 toward the second through hole 52 (lower end of second wall 65 in example of FIG. 2). In other words, the width of the communication hole 53 decreases from the first wall 55 toward the narrowest portion A1, and from the second wall 65 toward the narrowest portion A1.

The lower surface of the insulation layer 40 that defines the wall of the communication hole 53 is inclined relative to the first direction D1. For example, the lower surface of the insulation layer 40 that defines the wall of the communication hole 53 is inclined upward from the narrowest portion A1 toward the lower end of the first wall 55, and inclined upward from the narrowest portion A1 toward the lower end of the second wall 65.

The communication hole 53, for example, opens downward, that is, into the wiring layer 32. The communication hole 53 is, for example, in direct communication with the first recessed portion 34. The communication hole 53 is, for example, in direct communication with the second recessed portion 35. The narrowest portion A1 of the communication hole 53 overlaps, for example, the part where the open end of the first recessed portion 34 is connected to the open end of the second recessed portion 35 in plan view.

Formation of the communication hole 53 eliminates the first outer end 57 from the part of the first depression 56 that defines the communication hole 53. In the same manner, formation of the communication hole 53 eliminates the second outer end 67 from the part of the second depression 66 that defines the communication hole 53.

The length of the communication hole 53 in the first direction D1, that is, the distance from the lower end of the first wall 55 of the first through hole 51 to the lower end of the second wall 65 of the second through hole 52 in the first direction D1 is, for example, approximately 30 µm to 100 µm. The depth of the communication hole 53, that is, the distance from the lower end of the first wall 55 to the upper surface of the wiring layer 32 in the second direction D2 is, for example, approximately 1 µm to 5 µm.

Exemplary Structure of Via Wiring 50V

The via wiring 50V fills, for example, the through hole 50 in addition to the recessed portion 33 of the wiring layer 32. The via wiring 50V fills, for example, the first recessed portion 34 and the second recessed portion 35 of the wiring layer 32. The via wiring 50V fills the first through hole 51, including the first depression 56, and the second through hole 52, including the second depression 66. The via wiring 50V covers, for example, the lower surface of the insulation layer 40 forming the wall of the communication hole 53. Thus, in the communication hole 53, the via wiring 50V extends into the lower side of the insulation layer 40. The via wiring 50V covers, for example, the lower surface of the insulation layer 40 that defines the first surface 58 of the first depression 56. The via wiring 50V covers, for example, the lower surface of the insulation layer 40 defining the second surface 68 of the second depression 66. Thus, in the first depression 56 and the second depression 66, the via wiring 50V extends into the lower side of the insulation layer 40.

The via wiring 50V covers the upper surface of the wiring layer 32 that is exposed by the through hole 50. The via wiring 50V entirely covers the surface of the recessed portion 33 exposed by the through hole 50. The via wiring 50V entirely covers the surface of the first recessed portion 34, exposed by the through hole 50, and the second recessed portion 35, exposed by the through hole 50.

The via wiring 50V includes, for example, a seed layer 70 and a metal layer 71. The seed layer 70 covers the wall of the through hole 50 (i.e., surface of insulation layer 40 defining wall of through hole 50) and the upper surface of the wiring layer 32 exposed by the through hole 50. The metal layer 71 is formed on the seed layer 70 and fills the through hole 50 and the recessed portion 33.

The seed layer 70 continuously covers, for example, the wall of the through hole 50 and the upper surface of the wiring layer 32 exposed by the through hole 50. The seed layer 70 continuously covers, for example, the upper surface of the insulation layer 40, the entire surface of the first wall 55, the entire first surface 58, the entire surface of the first recessed portion 34, the entire surface of the second recessed portion 35, the entire second surface 68, and the entire surface of the second wall 65. The seed layer 70 continuously covers, for example, the upper surface of the insulation layer 40, the entire first wall 55, the lower surface of the insulation layer 40 defining the wall of the communication hole 53, and the entire second wall 65. The material of the seed layer 70 may be, for example, copper or a copper alloy. The seed layer 70 may be, for example, an electroless plating metal layer formed through an electroless plating process.

The metal layer 71 is formed in the first through hole 51 and the first depression 56 on the seed layer 70. For example, the first through hole 51 and the first depression 56 are filled with the metal layer 71. The metal layer 71 is formed on the seed layer 70 in the second through hole 52 and the second depression 66. For example, the second through hole 52 and the second depression 66 are filled with the metal layer 71. The metal layer 71 is formed in the communication hole 53 on the seed layer 70. For example, the communication hole 53 is filled with the metal layer 71. The metal layer 71 is formed on the seed layer 70 in the first recessed portion 34 and the second recessed portion 35. For example, the first recessed portion 34 and the second recessed portion 35 are filled with the metal layer 71. The metal layer 71 filling the communication hole 53 is located between the seed layer 70 covering the wall of the communication hole 53 and the seed layer 70 covering the surface of the recessed portion 33 in the second direction D2. The material of the seed layer 70 may be, for example, copper or a copper alloy. The metal layer 71 may be, for example, an electrolytic plating layer formed through an electrolytic plating process.

The via wiring 50V is formed by the seed layer 70 and the metal layer 71 formed in the through holes 50 and the recessed portion 33.

Exemplary Structure of Wiring Layer 82

The wiring layer 82 includes, for example, a first wiring pattern 83, and a second wiring pattern 84. The first wiring pattern 83 overlaps, for example, the first through hole 51 in plan view. The second wiring pattern 84 overlaps, for example, the second through hole 52 in plan view. The first wiring pattern 83 and the second wiring pattern 84 are not directly connected to each other on the upper surface of the insulation layer 40. Thus, the first wiring pattern 83 is separated from the second wiring pattern 84 on the upper surface of the insulation layer 40. The first wiring pattern 83 and the second wiring pattern 84 are connected to each other by the via wiring 50V.

The first wiring pattern 83 and the second wiring pattern 84 each include, for example, the seed layer 70, which is formed on the upper surface of the insulation layer 40, and a metal layer 72, which is formed on the seed layer 70 and the via wiring 50V (metal layer 71). The metal layer 72 projects, for example, upward from the upper surface of the insulation layer 40. The metal layer 72 is, for example, formed integrally with the metal layer 71. The material of the metal layer 72 may be, for example, copper or a copper alloy. The metal layer 72 may be, for example, an electrolytic plating metal layer formed through an electrolytic plating process.

As described above, the via wiring 50V, which fills the communication hole 53 and the first and second through holes 51 and 52, electrically connects the wiring layer 32 and the wiring layer 82. The first through hole 51 and the second through hole 52 are in communication with each other through the communication hole 53.

In FIG. 2, the tip of the first outer end 57, the tip of the second outer end 67, and the narrowest portion A1 are each formed at an acute angle. The tip of the first outer end 57, the tip of the second outer end 67, and the narrowest portion A1, however, may actually be curved. In the same manner as FIG. 2, the tip of the first outer end 57, the tip of the second outer end 67, and the narrowest portion A1 are illustrated as being formed at acute angles in the other drawings.

The wiring substrate 10 may be reversed upside-down or arranged at any angle.

A method for manufacturing the wiring substrate 10 will now be described with reference to FIGS. 4 to 13. A method for manufacturing the via wiring 50V and the wiring layer 82 of the wiring substrate 10 will be described. To simplify illustration, elements that will consequently become final elements of the wiring substrate 10 are given the same reference characters as the final elements.

Figure 4:
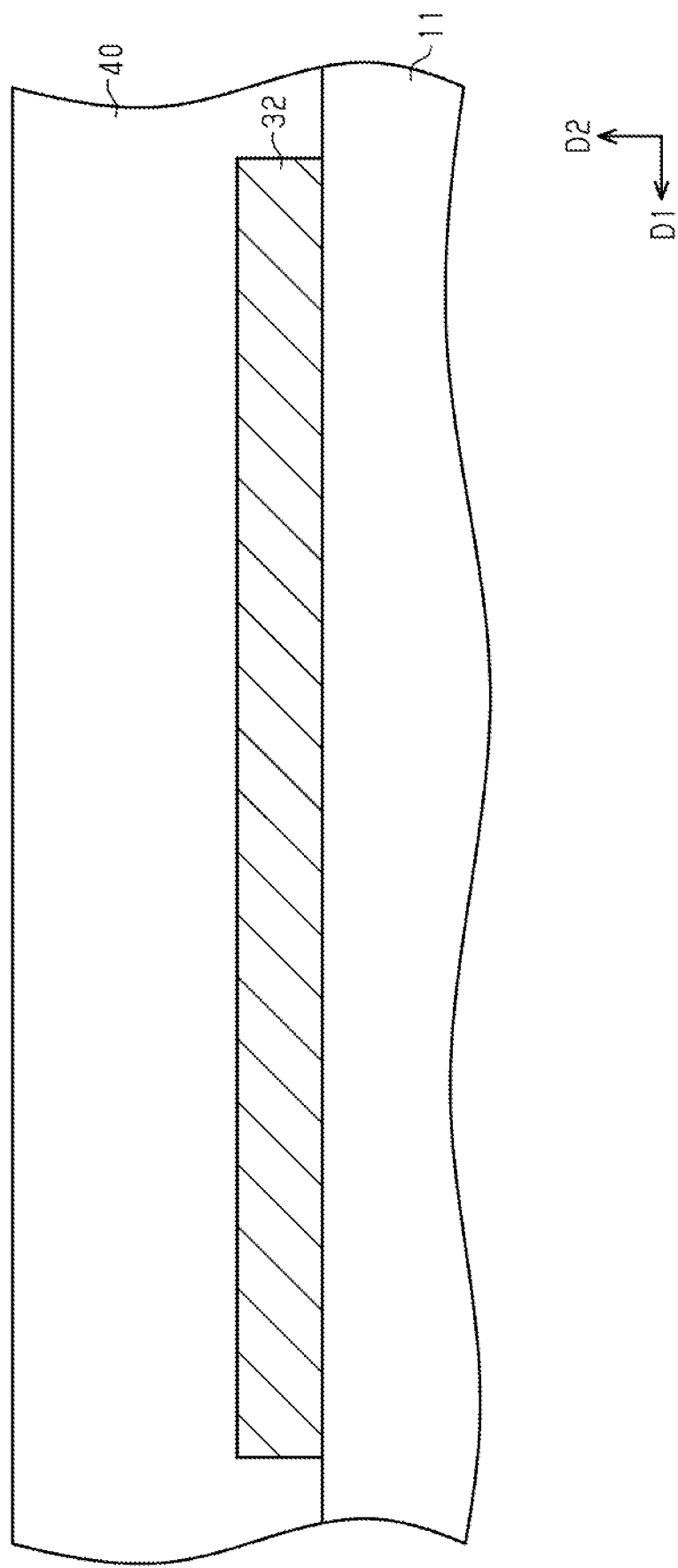
FIGS. 4, 5, 6, 7, 8, 9, 10, 11, 12, and 13 are schematic cross-sectional views illustrating a method for manufacturing the wiring substrate of FIG. 1.

With reference to FIG. 4, a structure is prepared in which the wiring layer 32 is formed on the upper surface of the substrate body 11, and the insulation layer 40 covering the surfaces (upper surface and side surface) of the wiring layer 32 is formed on the upper surface of the substrate body 11. The method for manufacturing the structure is known in the art and thus will not be described.

Figure 5:
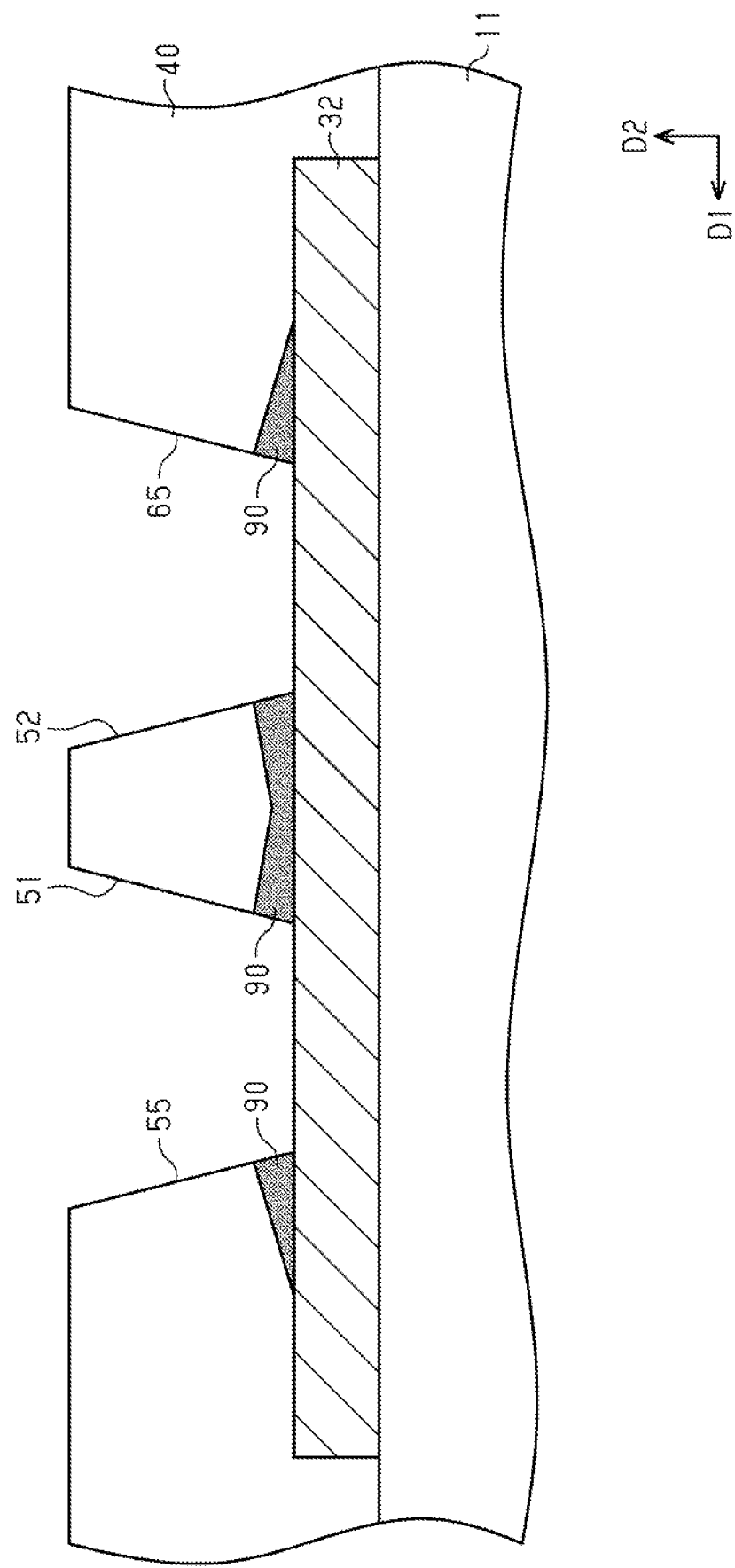

In the step illustrated in FIG. 5, the first through hole 51, which exposes the upper surface of the wiring layer 32, and the second through hole 52, which is adjacent to the first through hole 51 and which exposes the upper surface of the wiring layer 32, is formed in the insulation layer 40. The first through hole 51 and the second through hole 52 may be formed by, for example, irradiating the insulation layer 40 with a laser beam. In this manner, laser drilling is performed to form the first through hole 51 and the second through hole 52. The laser source that emits the laser beam may be, for example, a $CO_2$ laser or a UV-YAG laser.

The laser beam emitted toward the insulation layer 40 has an intensity (energy) that is sufficient for forming the first through hole 51 (or second through hole 52) that has the desired diameter with a single shot, or single emission. For example, the formation of the first through hole 51 in an insulation layer 40 that includes inorganic fillers will require energy that is a multiple number of times (e.g., at least three times) greater than the energy used to form the first through hole 51 in an insulation layer 40 that does not include inorganic fillers with a single shot. In such a case, the total energy corresponding to multiple shots of the laser beam is set as the energy used in a single shot of the laser beam.

When the insulation layer 40 is irradiated with a laser beam, the energy of the laser beam heats the wiring layer 32. The heat of the wiring layer 32 alters portion 90 of the insulation layer 40 that is in contact with the upper surface of the wiring layer 32. To aid understanding, portion 90 may be referred to as the altered portion 90. The heat of the wiring layer 32 is transmitted from the portion irradiated with the laser beam, that is the central portion of the first through hole 51 (or second through hole 52), to the peripheral portion. Thus, the altered portion 90 increases in thickness as the center of the first through hole 51 (or second through hole 52) becomes closer and decreases in thickness as the center of the first through hole 51 (or second through hole 52) becomes farther. Further, the altered portion 90 is formed around the entirety of the first through hole 51 (or second through hole 52) in the circumferential direction. Alteration of portion 90 in the insulation layer 40 includes thermal decomposition that carbonates the resin included in the insulation layer 40 and melting of the resin in the insulation layer 40.

Figure 6:
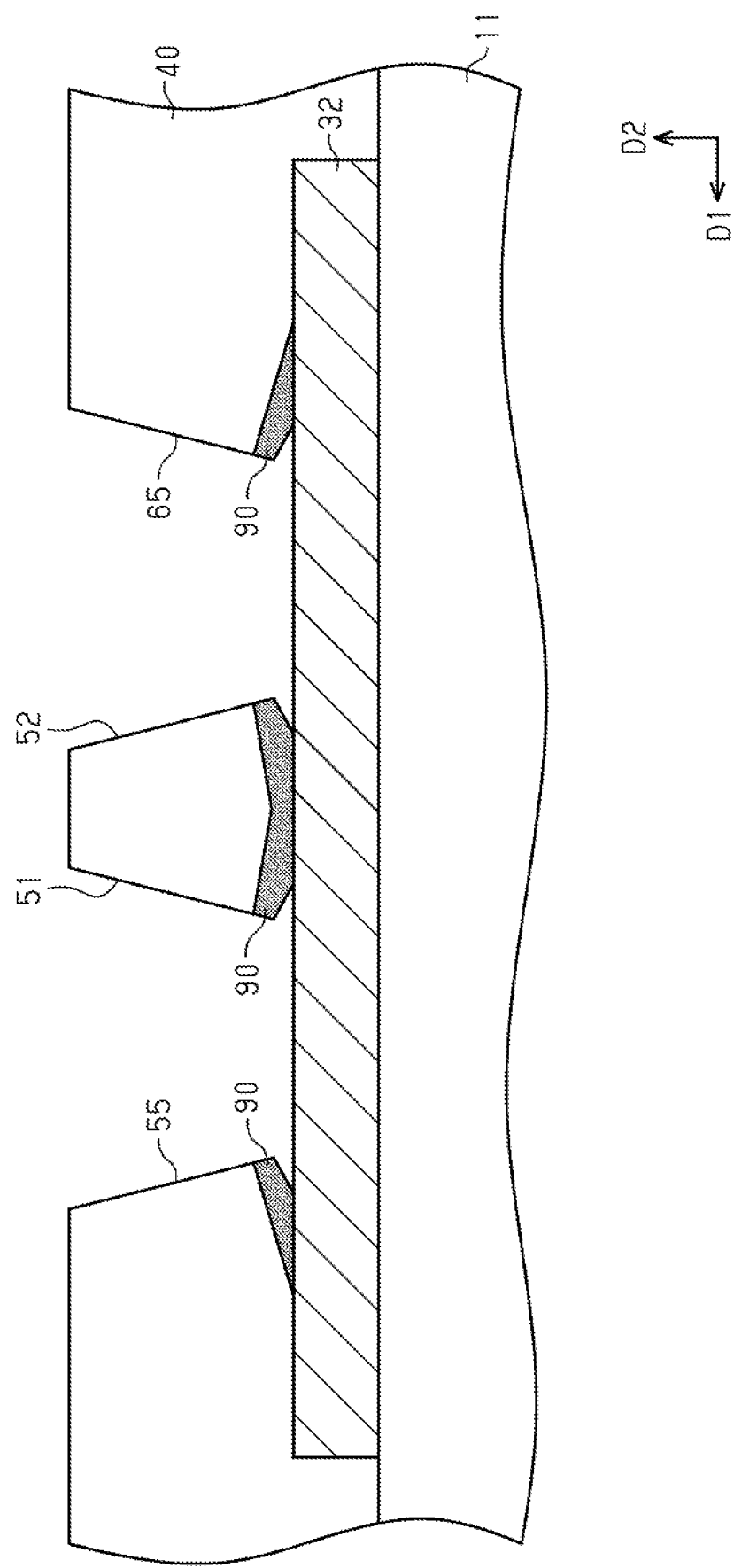

In the step illustrated in FIG. 6, a first desmearing process is performed to remove smeared resin (resin residue) from the upper surface of the wiring layer 32 that is exposed at the bottom of each of the first and second through holes 51 and 52. The first desmearing process may be performed through, for example, a permanganate process or the like. The first desmearing process partially removes the altered portion 90. With reference to FIG. 6, the first desmearing process partially removes the altered portion 90 at the lower side of the first wall 55 of the first through hole 51 and partially removes the altered portion 90 at the lower side of the second wall 65 of the second through hole 52. This widens the bottom portion of the first through hole 51 and the bottom portion of the second through hole 52.

Figure 7:
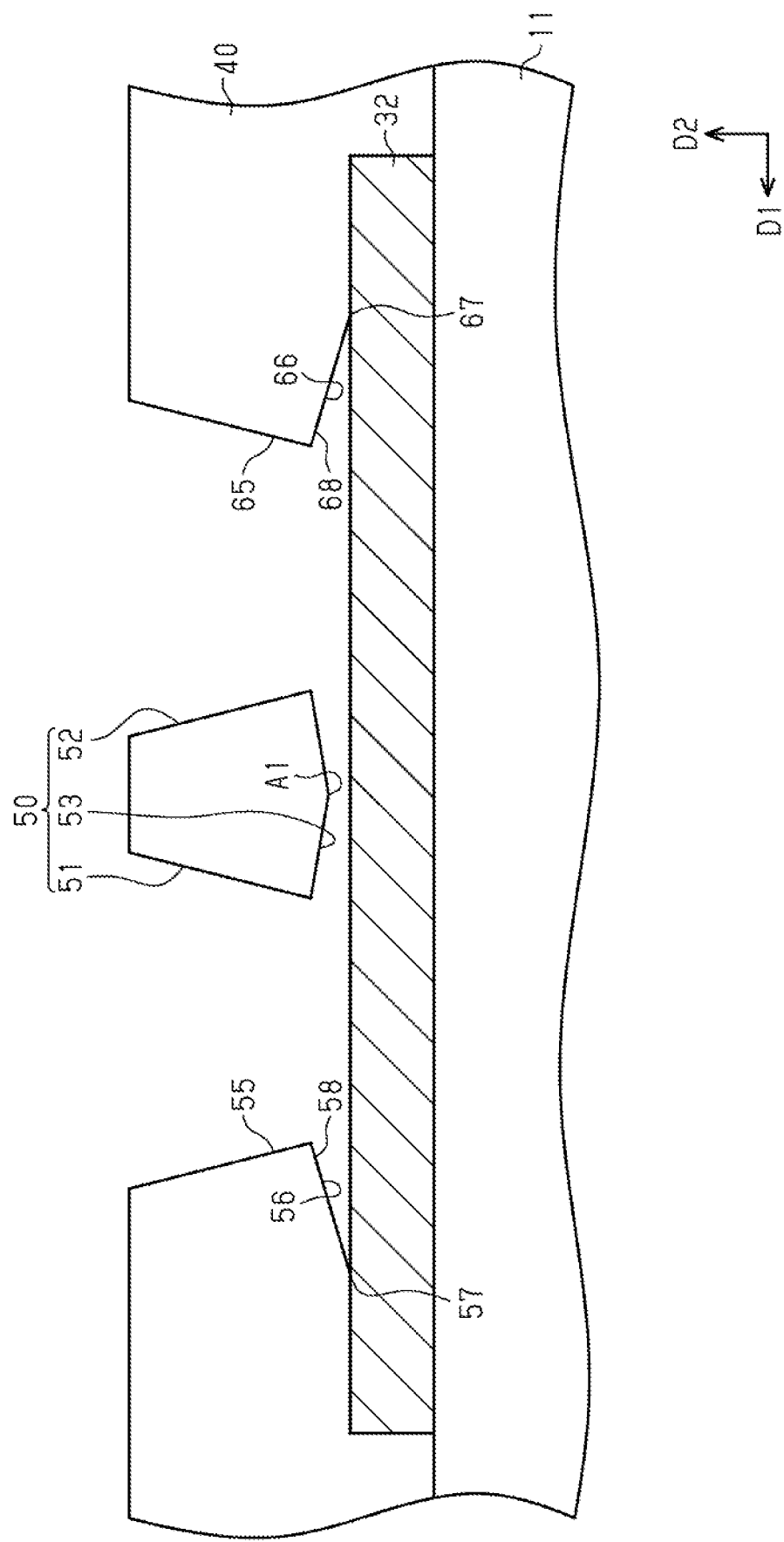

In the step illustrated in FIG. 7, a second desmearing process, which differs in processing condition from the first desmearing process, is performed to form the communication hole 53 through which the bottom portion of the first through hole 51 is in communication with the bottom portion of the second through hole 52. The second desmearing process may be performed through, for example, a permanganate process or the like. The processing conditions, such as the processing time, in the second desmearing process differs from the processing conditions of the first desmearing process. The second desmearing process further widens the bottom portion of the first through hole 51 and the bottom portion of the second through hole 52. The second desmearing process removes the remainder of the altered portion 90 (refer to FIG. 6) and widens the bottom portions of the first through hole 51 and the second through hole 52. In this manner, the bottom portions of the first through hole 51 and the second through hole 52 are widened to form the communication hole 53. The second desmearing process, which removes the remainder of the altered portion 90 (refer to FIG. 6), forms the first depression 56 at the bottom portion of the first through hole 51 and the second depression 66 at the bottom portion of the second through hole 52.

In the manufacturing steps described above, the through hole 50 formed in the insulation layer 40 has a structure in which the first through hole 51 is in communication with the second through hole 52 through the communication hole 53.

Figure 8:
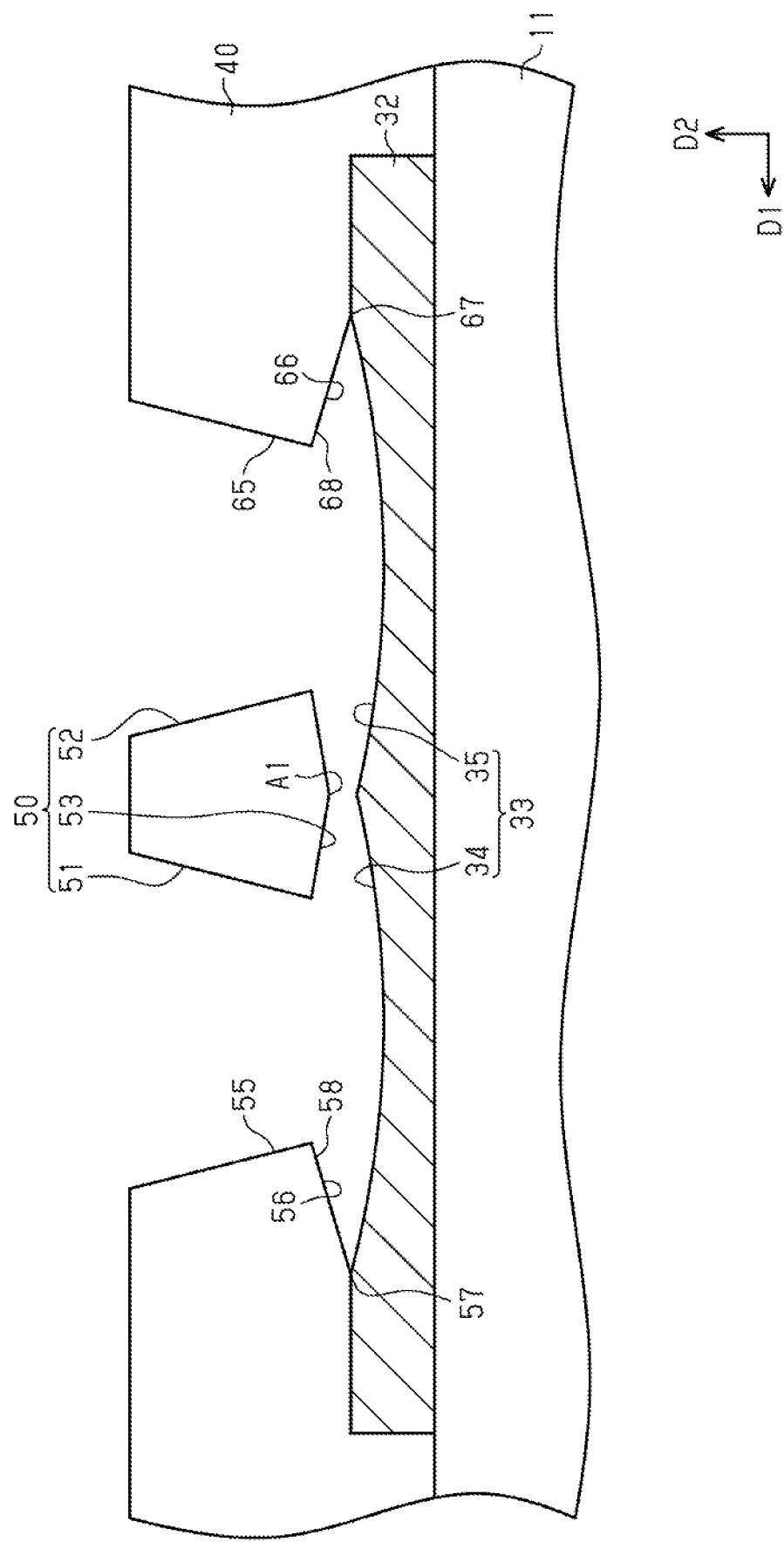

In the step illustrated in FIG. 8, the recessed portion 33, which is in communication with the through holes 50, is formed in the upper surface of the wiring layer 32, which is exposed by the through hole 50 of the insulation layer 40. The recessed portion 33 may be formed by, for example, etching the wiring layer 32 using the insulation layer 40 as an etching mask. The recessed portion 33 is formed by the first recessed portion 34 and the second recessed portion 35 that are continuous with each other. The first recessed portion 34 is formed in, for example, the upper surface of the wiring layer 32 exposed at the bottom portion of the first through hole 51. The second recessed portion 35 is formed in, for example, the upper surface of the wiring layer 32 exposed at the second through hole 52.

Figure 9:
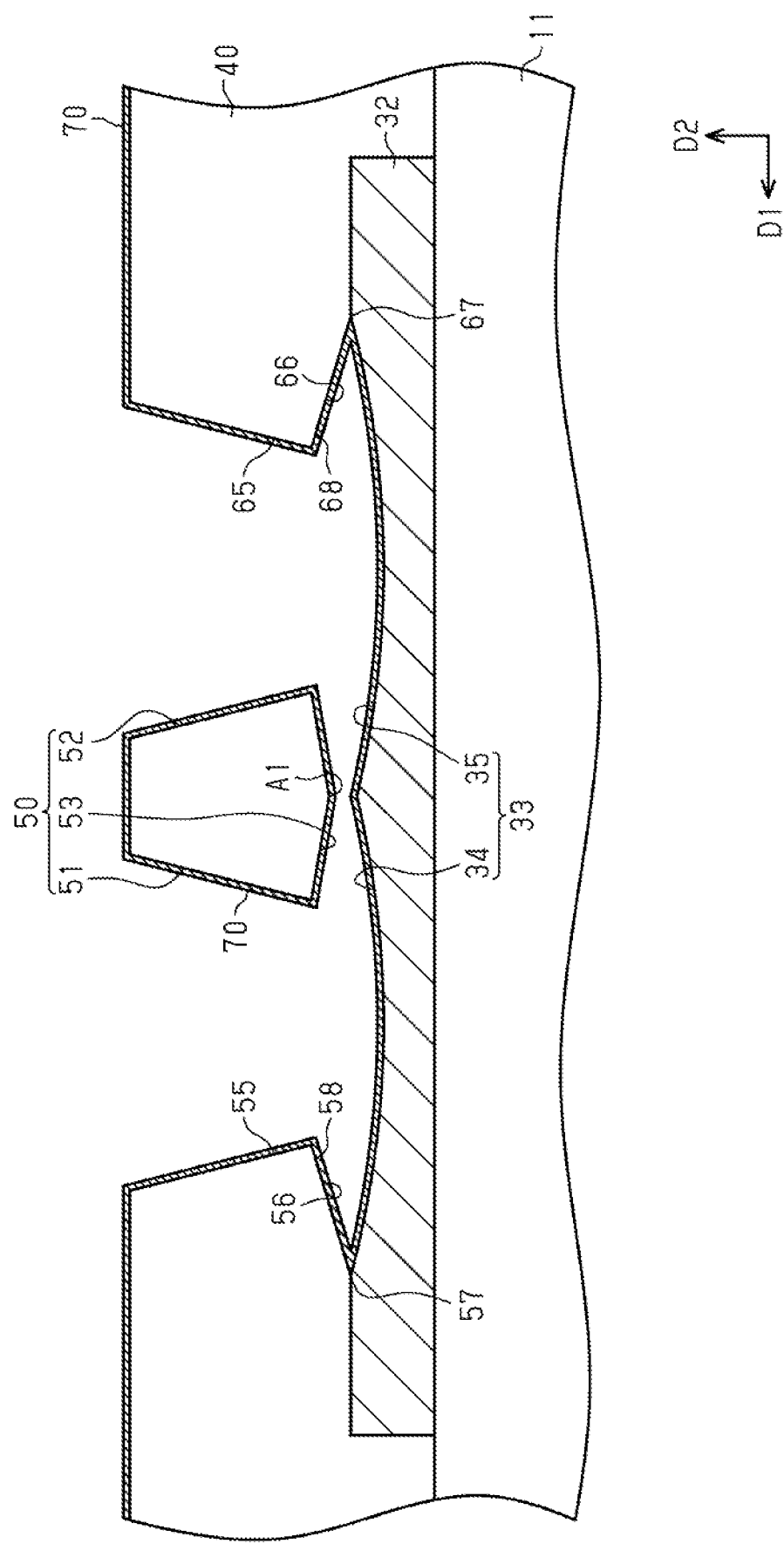

In the step illustrated in FIG. 9, the seed layer 70 is formed continuously on the entire upper surface of the insulation layer 40, the entire wall surface of the through hole 50, and the entire surface of the recessed portion 33. The seed layer 70 is formed through, for example, an electroless plating process. The seed layer 70 may be formed through an electroless copper plating process using, for example, a plating solution obtained by mixing copper sulfate, sodium hydroxide, carboxylate, nickel sulfate, and formaldehyde.

Figure 10:
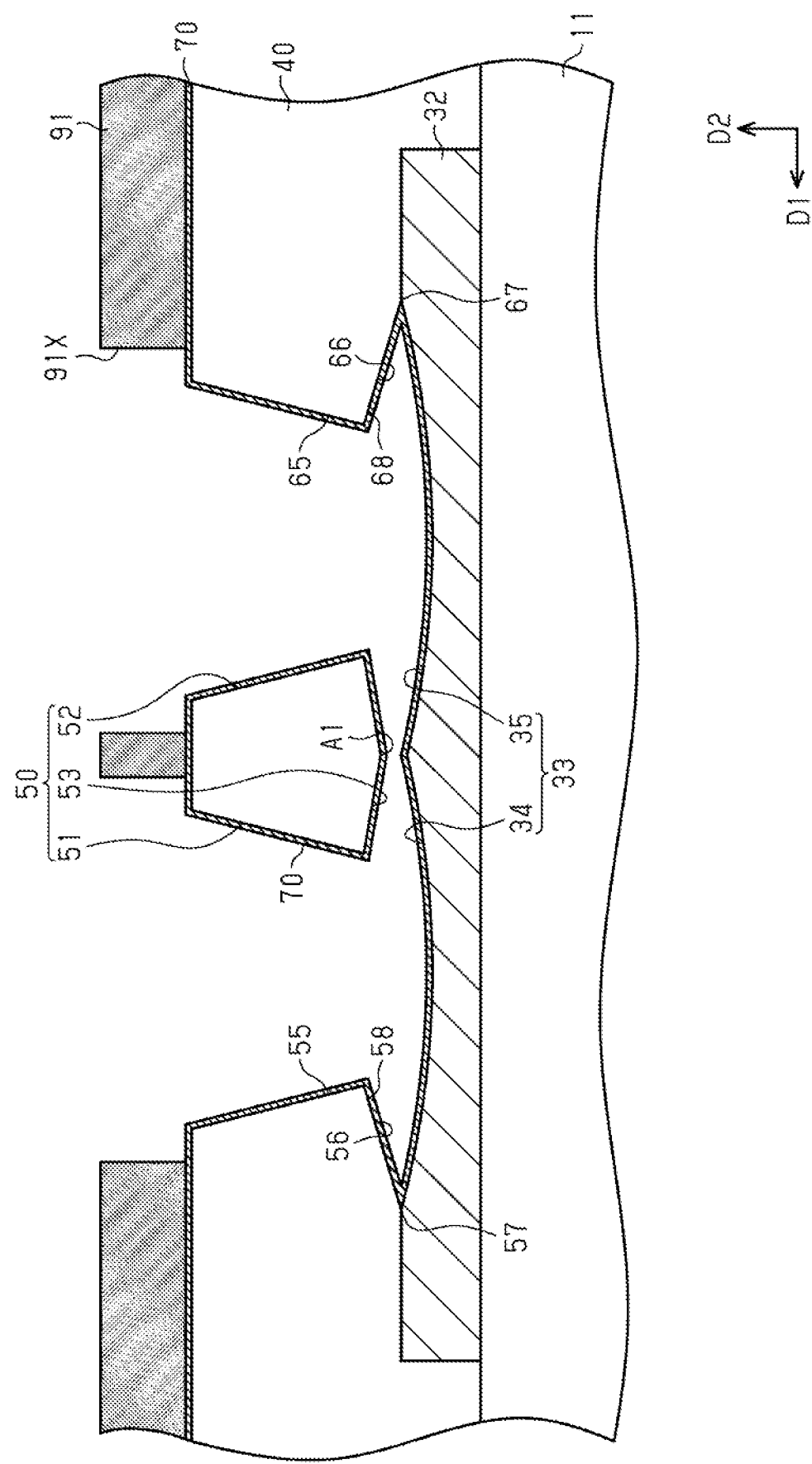

In the step illustrated in FIG. 10, a resist layer 91 including an opening pattern 91X is formed on the seed layer 70, which is formed on the upper surface of the insulation layer 40. The opening pattern 91X exposes the portion of the seed layer 70 that corresponds to a region for formation of the wiring layer 82, or the first wiring pattern 83 and the second wiring pattern 84 (refer to FIG. 2). The material of the resist layer 91 may be, for example, a material that resists plating in the electrolytic plating process performed in the following step. For example, a photosensitive dry film resist or a liquid photoresist may be used as the resist layer 91. Examples of such a resist material include a novolak resin, an acrylic resin, or the like. For example, when using a photosensitive dry film resist, thermal compression bonding is performed to laminate a dry film onto the upper surface of the seed layer 70, and a photolithography process is performed to pattern the dry film and form the resist layer 91 including the opening patterns 91X. When using a liquid photoresist, the resist layer 91 may be performed through a similar process.

Figure 11:
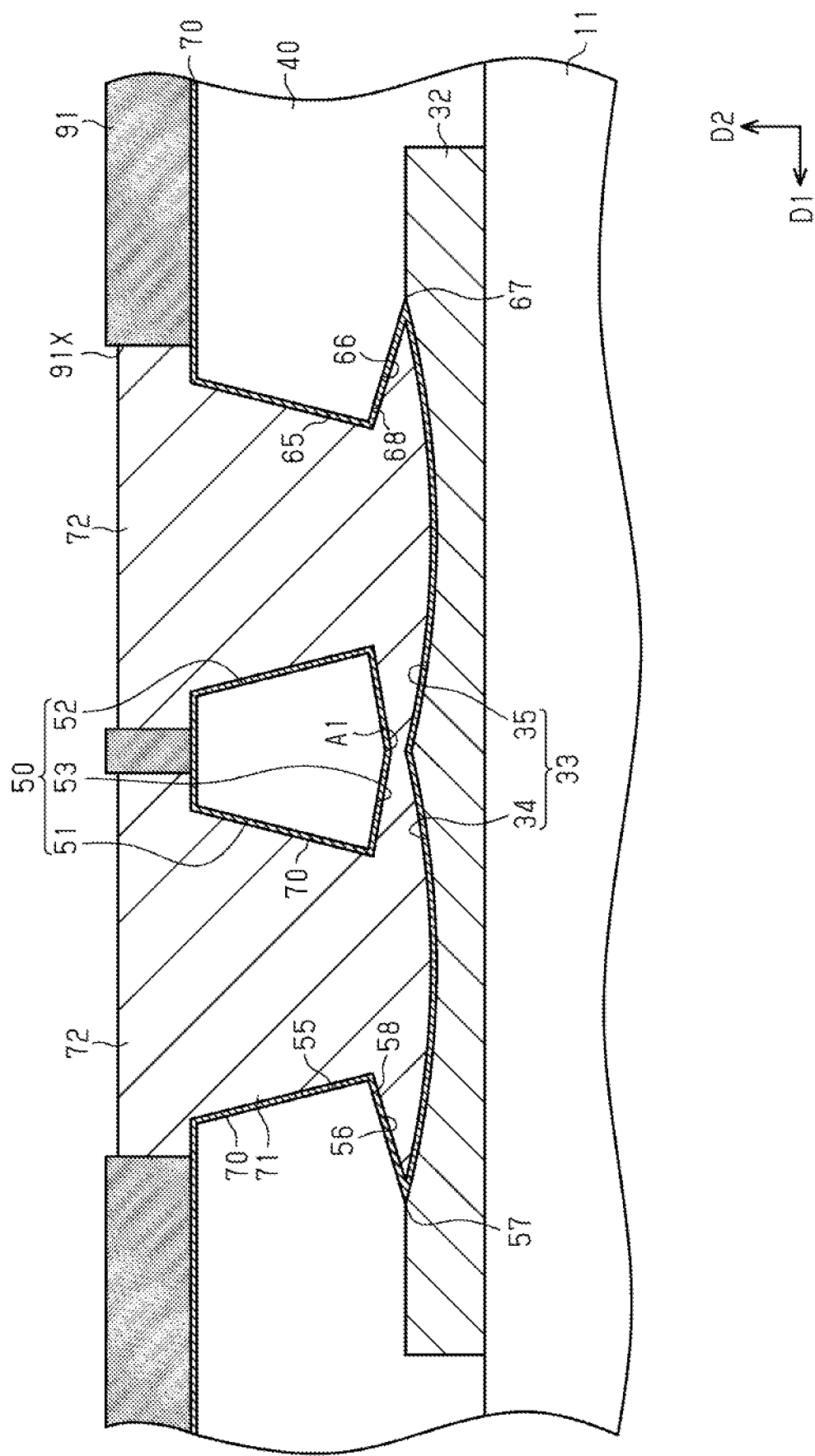

In the step illustrated in FIG. 11, electrolytic plating (e.g., electrolytic copper plating) is performed on the upper surface of the seed layer 70 exposed from the opening pattern 91X of the resist layer 91 using the resist layer 91 as a plating mask and the seed layer 70 as a power feeding layer. This fills the through hole 50 and the recessed portion 33 with the metal layer 71 that is formed on the seed layer 70, and forms the metal layer 72 in the opening pattern 91X. The metal layer 71 fills the first through hole 51, which includes the first depression 56, the second through hole 52, which includes the second depression 66, and the communication hole 53. The metal layer 72 is formed integrally with the metal layer 71.

Figure 12:
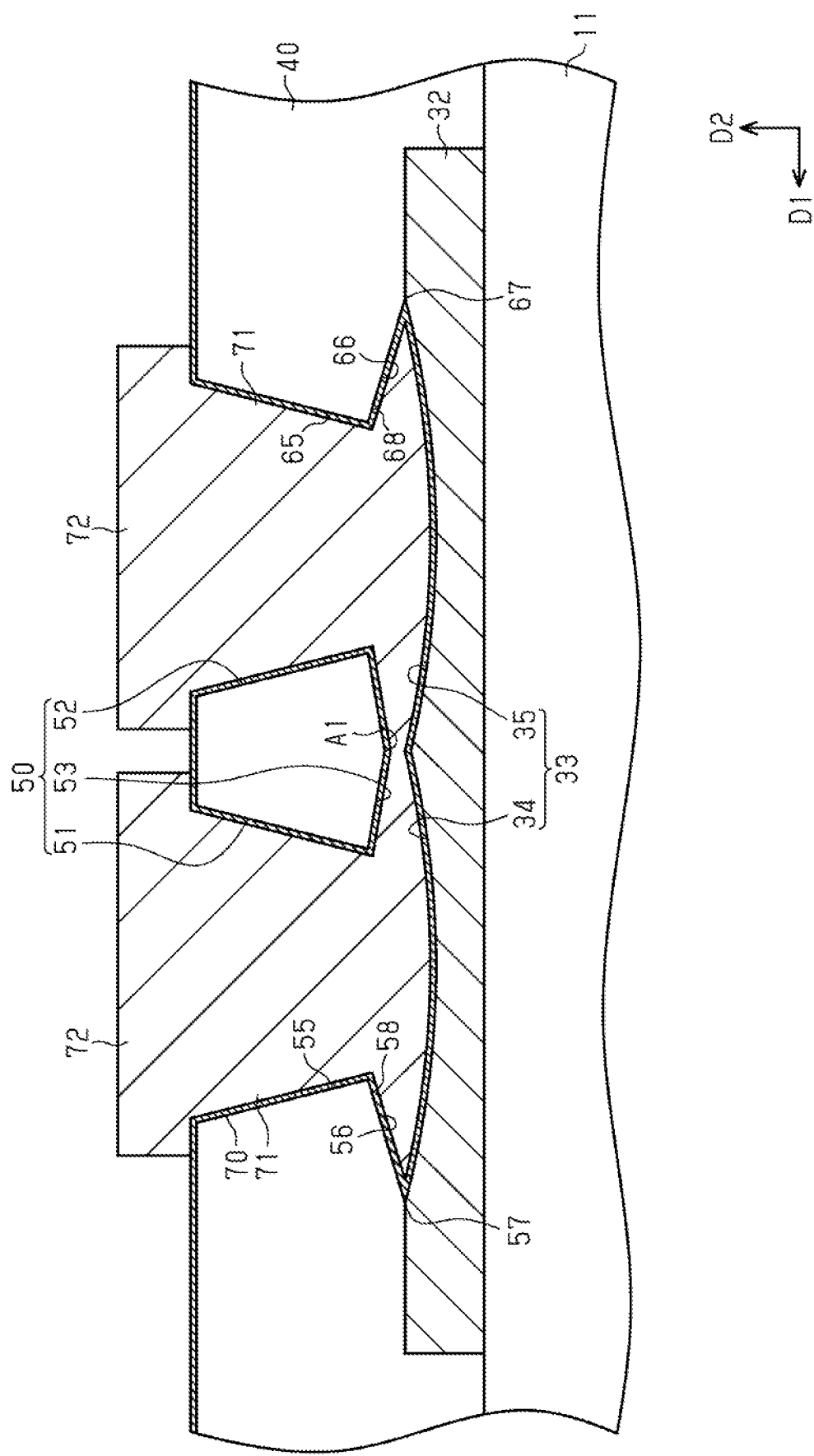

In the step illustrated in FIG. 12, the resist layer 91 of FIG. 11 is removed by an alkali delamination liquid (e.g., organic amine delamination liquid, caustic soda, acetone, or ethanol).

Figure 13:
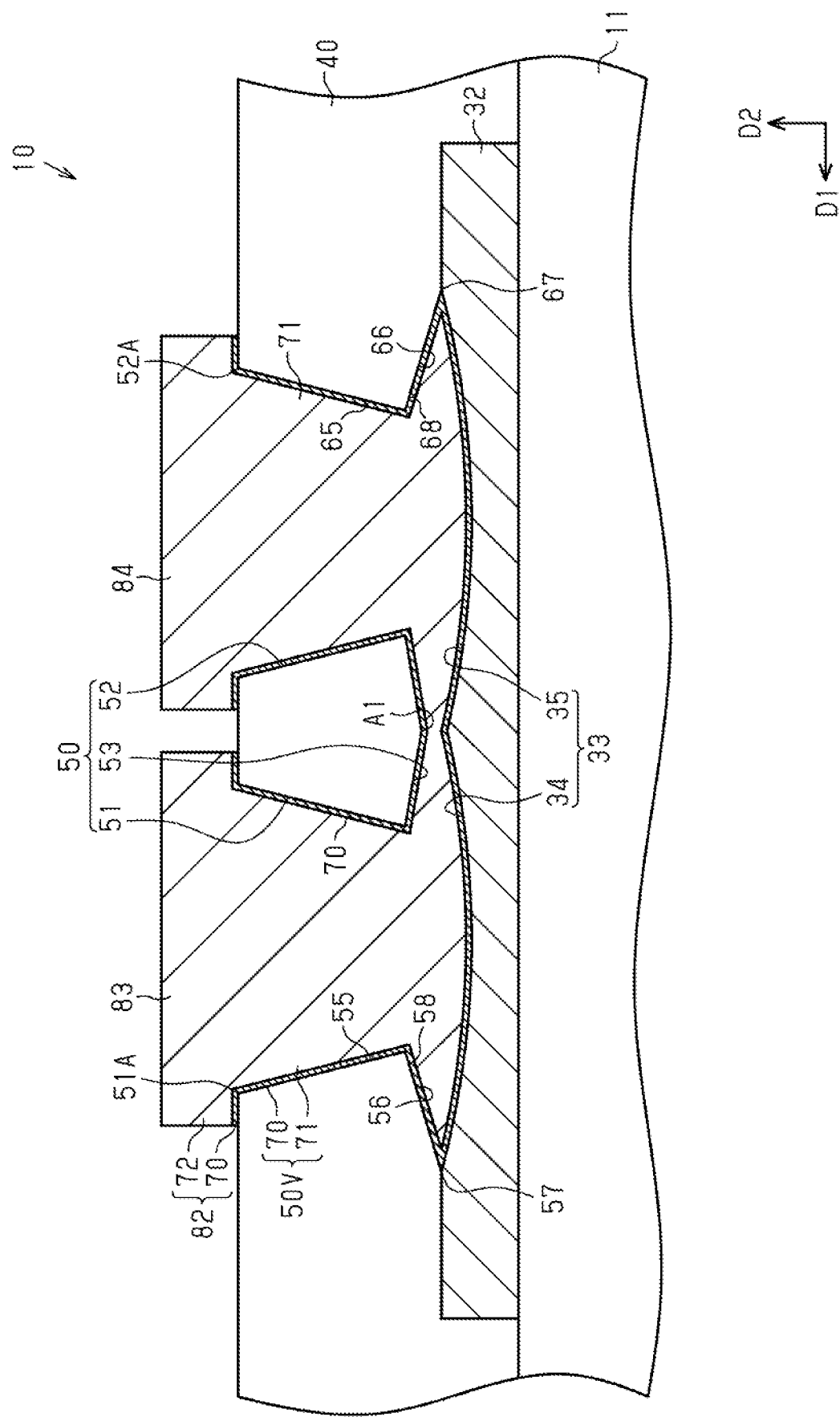

In the step illustrated in FIG. 13, etching is performed using the metal layer 72 as an etching mask to remove unnecessary portions of the seed layer 70. When the seed layer 70 is an electroless copper plating layer, wet etching is performed with a sulfuric acid/hydrogen peroxide etching liquid to remove unnecessary portions of the seed layer 70.

The manufacturing steps described above form the via wiring 50V including the seed layer 70, in the through hole 50 and the recessed portion 33, and the metal layer 71. Further, the seed layer 70 is formed on the upper surface of the insulation layer 40, and the wiring layer 82 is formed on the metal layer 72.

The above embodiment has the advantages described below.

(1) The wiring substrate 10 includes the wiring layer 32, the insulation layer 40 covering the upper surface of the wiring layer 32, and the through hole 50 extending through the insulation layer 40 in the thickness-wise direction. The through hole 50 includes the first through hole 51, which extends through the insulation layer 40 in the thickness-wise direction and exposes part of the upper surface of the wiring layer 32, and the second through hole 52, which is adjacent to the first through hole 51 and which extends through the insulation layer 40 in the thickness-wise direction and exposes the upper surface of the wiring layer 32. The through holes 50 includes the communication hole 53 through which the bottom portion of the first through hole 51 is in communication with the bottom portion of the second through hole 52. The wiring substrate 10 includes the via wiring 50V and the wiring layer 82. The via wiring 50V fills the first through hole 51, the second through hole 52, and the communication hole 53. The wiring layer 82 is formed integrally with the via wiring 50V on the upper surface of the insulation layer 40.

With this structure, the arrangement of the communication hole 53 in the through hole 50 results in the communication of the first through hole 51 with the second through hole 52 through the communication hole 53. The bottom surface of the via wiring 50V is joined with the upper surface of the wiring layer 32 that is exposed by the first through hole 51, the second through hole 52, and the communication hole 53. Thus, for example, the area where the bottom surface of the via wiring 50V is joined with the wiring layer 32 is larger than that when the bottom surface of the via wiring 50V is joined with the upper surface of the wiring layer 32 that is exposed from only the first through hole 51. This increases the joining strength of the via wiring 50V and the wiring layer 32 and improves the reliability of the electrical connection between the via wiring 50V and the wiring layer 32. Further, when thermal stress acts on the interface of the via wiring 50V and the wiring layer 32 during reliability tests or the like conducted in thermal cycles, the enlarged joining area of the via wiring 50V and the wiring layer 32 will disperse such thermal stress. This will avoid the formation of cracks in the interface of the via wiring 50V and the wiring layer 32 that would be caused by thermal stress. As a result, the reliability of the electrical connection between the via wiring 50V and the wiring layer 32 is improved.

(2) The wiring layer 32 is electrically connected to the wiring layer 82 by both the via wiring 50V in the first through hole 51 and the via wiring 50V in the second through hole 52. Thus, even if, for example, a crack forms in the interface of the via wiring 50V and the wiring layer 32 at the bottom portion of the first through hole 51, the via wiring 50V in the second through hole 52 will electrically connect the wiring layer 32 and the wiring layer 82. As a result, the reliability of the electrical connection between the via wiring 50V and the wiring layer 32 is improved.

(3) The part of the via wiring 50V that fills the communication hole 53 covers the lower surface of the insulation layer 40 that defines the wall of the communication hole 53. Thus, the via wiring 50V overlaps the insulation layer 40 at where the communication hole 53 is located in plan view. This restricts separation of the via wiring 50V from the insulation layer 40.

(4) The communication hole 53 increases the width at the bottom portion of the first through hole 51 and increases the width at the bottom portion of the second through hole 52. This increases the width at the bottom portion of the through hole 50 that includes the first through hole 51, the second through hole 52, and the communication hole 53. Thus, the bottom surface of the via wiring 50V is joined with the wiring layer 32 over a wide area. As a result, the reliability of the electrical connection between the via wiring 50V and the wiring layer 32 is improved.

(5) The middle of the communication hole 53, in the first direction D1 in which the first through hole 51 and the second through hole 52 are arranged, is where the depth of the communication hole 53 is the minimum. The communication hole 53 increases in depth from its middle position toward the first through hole 51 in the first direction D1 and from its middle position toward the second through hole 52 in the first direction D1. The lower surface of the insulation layer 40 defining the wall of the communication hole 53 is inclined relative to the first direction D1. Thus, the area of contact between the lower surface of the insulation layer 40 and the via wiring 50V is greater than when the lower surface of the insulation layer 40 defining the wall of the communication hole 53 extends parallel to the first direction D1. This increases the strength joining the insulation layer 40 and the via wiring 50V.

(6) The first through hole 51 includes the first wall 55, which extends downward from the upper surface of the insulation layer 40, and the first depression 56, which extends toward an outer side of the first through hole 51 from the first wall 55. The second through hole 52 includes the second wall 65, which extends downward from the upper surface of the insulation layer 40, and a second depression 66, which extends toward an outer side of the second through hole 52 from the second wall 65. The first depression 56 is formed continuously around the entirety of the first through hole 51 in the circumferential direction. The second depression 66 is formed continuously around the entirety of the second through hole 52 in the circumferential direction.

This structure widens the bottom portion of the first through hole 51 and the bottom portion of the second through hole 52. The large width at the bottom portion of the through hole 50 including the first through hole 51, the second through hole 52, and the communication hole 53 increases the area where the bottom surface of the via wiring 50V is joined with the wiring layer 32. As a result, the reliability of the electrical connection between the via wiring 50V and the wiring layer 32 is improved.

(7) The upper surface of the wiring layer 32 includes the first recessed portion 34, which is in communication with the first through hole 51, and the second recessed portion 35, which is in communication with the second through hole 52. Thus, the area where the bottom surface of the via wiring 50V is joined with the wiring layer 32 is greater than that when the upper surface of the wiring layer 32 exposed from the through hole 50 extends parallel to the first direction D1. As a result, the reliability of the electrical connection between the via wiring 50V and the wiring layer 32 is improved.

OTHER EMBODIMENTS

The above embodiment may be modified as described below. The above embodiment and the modified examples described below may be combined as long as there is no technical contradiction.

The width of the first recessed portion 34 is not particularly limited. For example, the open end of the first recessed portion 34 may be farther from the center of the first through hole 51 than the first outer end 57 of the first depression 56 in plan view. Alternatively, the open end of the first recessed portion 34 may be closer to the center of the first through hole 51 than the first outer end 57 of the first depression 56 in plan view.

The width of the second recessed portion 35 is not particularly limited. For example, the open end of the second recessed portion 35 may be farther from the center of the second through hole 52 than the second outer end 67 of the second depression 66. Alternatively, for example, the open end of the second recessed portion 35 may be closer to the center of the second through hole 52 than the second outer end 67 of the second depression 66.

Figure 14:
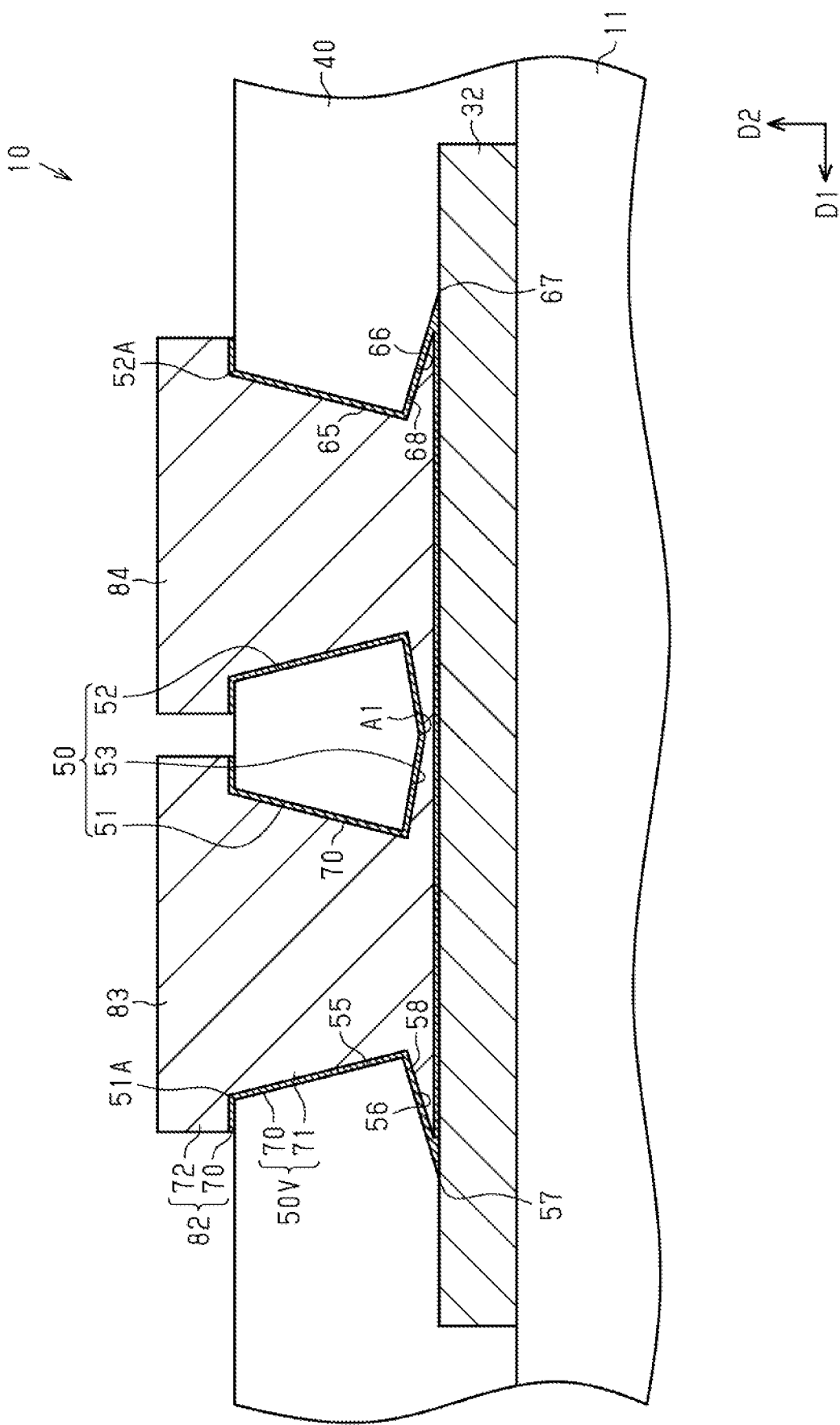
FIG. 14 is a schematic cross-sectional view illustrating, in an enlarged manner, part of the wiring substrate of a modified example.

As illustrated in FIG. 14, the recessed portion 33 of the wiring layer 32 may be omitted. That is, the first recessed portion 34 and the second recessed portion 35 of the wiring layer 32 may be omitted. In this case, the upper surface of the wiring layer 32 exposed from the bottom portion of the through hole 50 is, for example, flat. The via wiring 50V is formed on the upper surface of the wiring layer 32 exposed from the through hole 50. In the present example, the via wiring 50V fills only the through hole 50. Further, the seed layer 70 of this modified example covers the entire wall of the through hole 50 and the entire upper surface of the wiring layer 32 exposed from the through hole 50.

In the above embodiment, the first wiring pattern 83, which is directly connected to the via wiring 50V in the first through hole 51, and the second wiring pattern 84, which is directly connected to the via wiring 50V in the second through hole 52, are spaced apart from each other on the upper surface of the insulation layer 40. In other words, the first wiring pattern 83 and the second wiring pattern 84, which are electrically connected to the wiring layer 32 by the via wiring 50V, are located on the upper surface of the insulation layer 40. This structure may be modified as described below.

Figure 15:
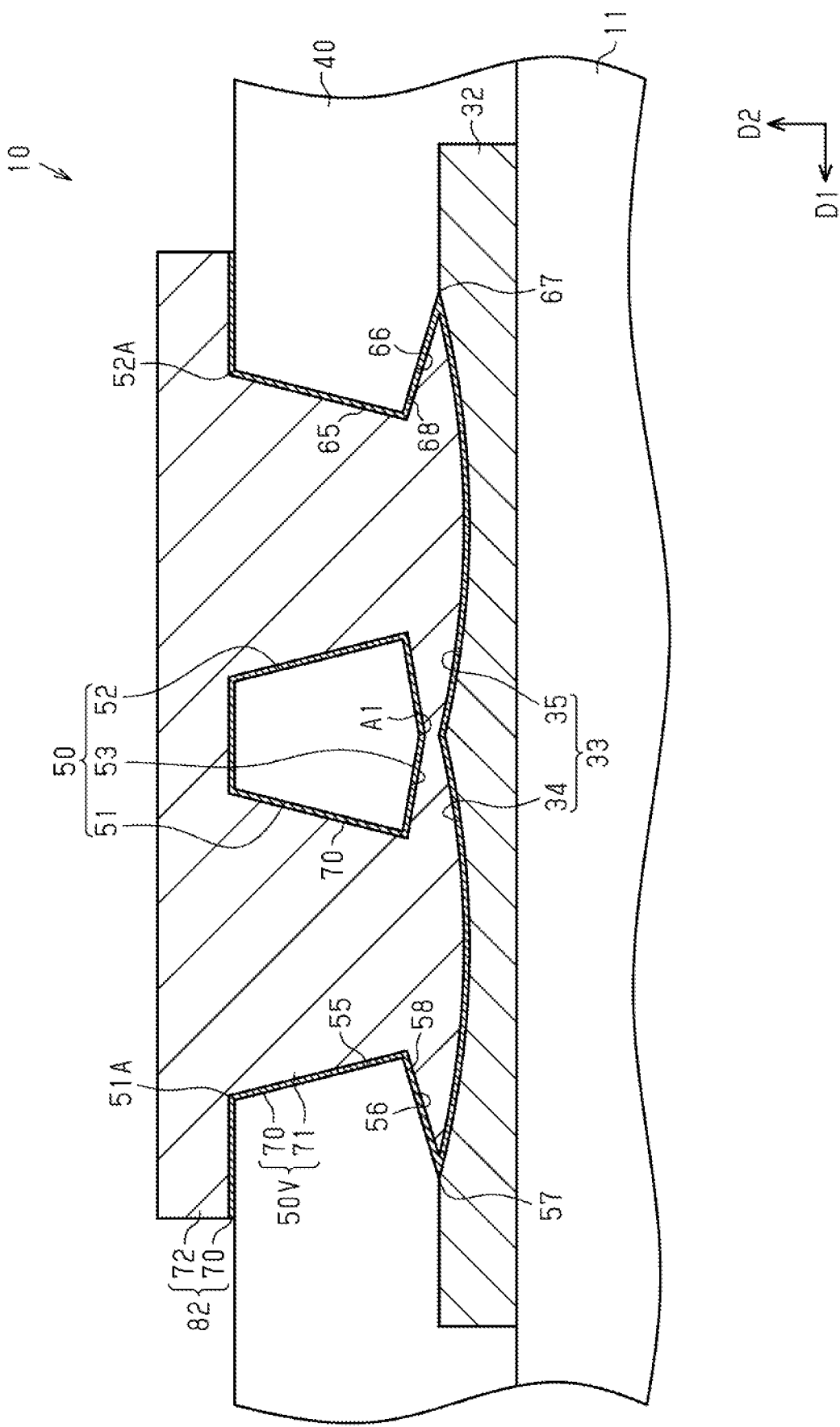
FIG. 15 is a schematic cross-sectional view illustrating, in an enlarged manner, part of the wiring substrate of another modified example.

With reference to FIG. 15, for example, a single wiring layer 82, which is electrically connected to the wiring layer 32 by the via wiring 50V, may be located on the upper surface of the insulation layer 40. That is, the wiring layer 82 located on the upper surface of the insulation layer 40 may be directly connected to both the via wiring 50V that fills the first through hole 51 and the via wiring 50V that fills the second through hole 52. In other words, the via wiring 50V in the first through hole 51 and the via wiring 50V in the second through hole 52 may be directly connected to the same wiring layer 82. The wiring layer 82 of this example connects the upper surface of the via wiring 50V in the first through hole 51 and the upper surface of the via wiring 50V in the second through hole 52.

Figure 16:
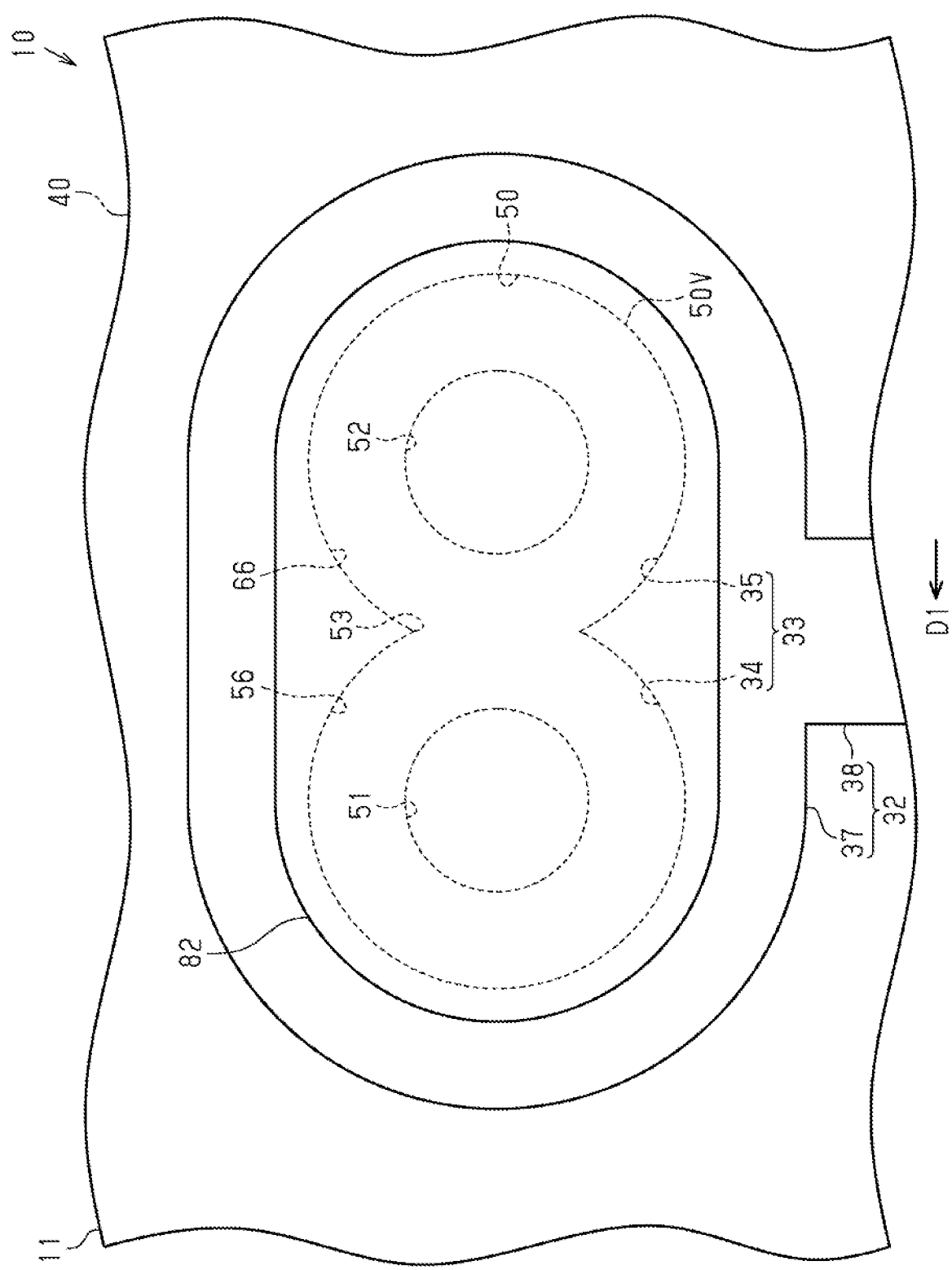
FIG. 16 is a schematic plan view of the wiring substrate illustrated in FIG. 15.

As illustrated in FIG. 16, the wiring layer 82 of this modified example overlaps the entirety of the first through hole 51 and the entirety of the second through hole 52 in plan view. Further, the wiring layer 82 of this modified example overlaps the entirety of the communication hole 53 in plan view. The wiring layer 82 of this modified example extends in the first direction D1 in which the first through hole 51 and the second through hole 52 are arranged. The wiring layer 82 of this modified example is elliptical in plan view and elongated in the first direction D1.

In the above embodiment, the wiring layer 32 is a planar layer but does not have to be a planar layer. For example, the wiring layer 32 may be signal wiring.

For example, referring to FIG. 16, the wiring layer 32 may be signal wiring including a pad 37, which is connected to the wiring layer 82, and a circuit pattern 38, which is connected to the pad 37. In the wiring layer 32 of this modified example, for example, the pad 37 is formed continuously and integrally with the circuit pattern 38. The through hole 50 exposes part of the upper surface of the pad 37. In the example of FIG. 16, the first through hole 51 exposes part of the upper surface of the pad 37, and the second through hole 52 exposes another part of the upper surface of the pad 37.

In the above embodiment, the via wiring 50V connects the wiring layer 82, which is the outermost wiring layer, and the wiring layer 32, which is located inward from the wiring layer 82. This, however, is not a limitation.

Figure 17:
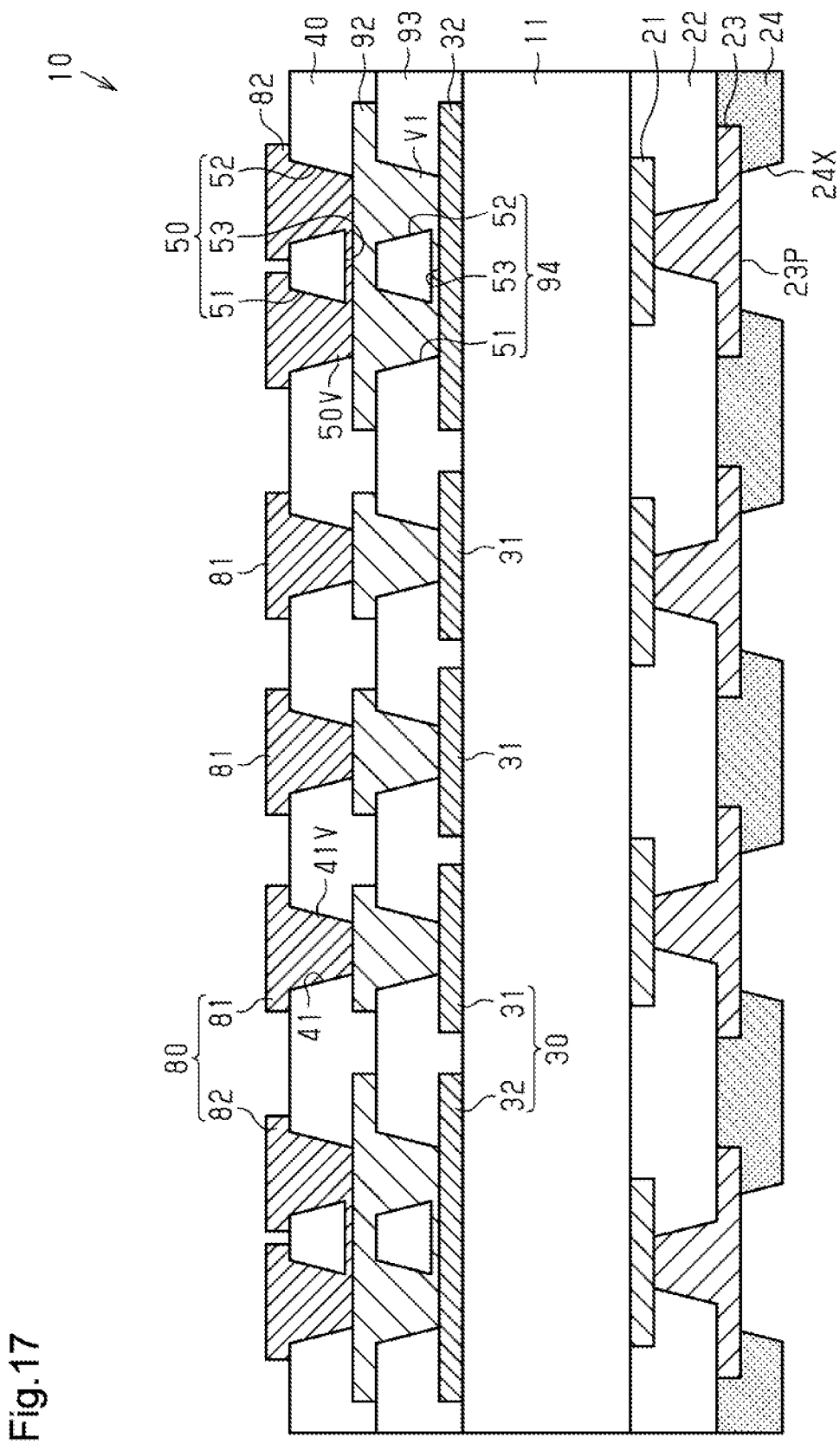
FIG. 17 is a schematic cross-sectional view illustrating a modified example of the wiring substrate.

For example, as illustrated in FIG. 17, via wiring V1 connecting a wiring layer 92, which is located inward from the outermost wiring layer 82, and the wiring layer 32, which is located inward from the wiring layer 92, may have the same structure as the via wiring 50V. The via wiring V1 extends through an insulation layer 93 that covers the upper surface of the wiring layer 32. The via wiring V1 is formed integrally with the wiring layer 92. A through hole 94, which extends through the insulation layer 93 in the thickness-wise direction, is filled with the via wiring V1. In the same manner as the through holes 50, the through hole 94 includes the first through hole 51, the second through hole 52, and the communication hole 53.

In the method for manufacturing the wiring substrate 10 in accordance with the above embodiment, after the formation of the first through hole 51 and the second through hole 52, a desmearing process is performed twice to form the communication hole 53, through which the first through hole 51 and the second through hole 52 are in communication. Instead, after the formation of the first through hole 51 and the second through hole 52, a desmearing process may be performed once to form the communication hole 53, through which the first through hole 51 and the second through hole 52 are in communication. Further, the communication hole 53 does not necessarily have to be formed through a desmearing process.

In the method for manufacturing the wiring substrate 10 in accordance with the above embodiment, laser drilling is performed to form the first through hole 51 and the second through hole 52. Instead, a process other than laser drilling may be performed to form the first through hole 51 and the second through hole 52.

In the above embodiment, the first wall 55 of the first through hole 51 may extend orthogonally to the upper surface of the insulation layer 40 in a cross-sectional view.

In the above embodiment, the second wall 65 of the second through hole 52 may extend orthogonally to the upper surface of the insulation layer 40 in a cross-sectional view.

In the above embodiment, the seed layer 70 has a single-layer structure. Instead, the seed layer 70 may have a multi-layer structure (e.g., double-layer structure). A seed layer 70 having a double-layer structure may be, for example, a stack of a titanium (Ti) layer and a Cu layer.

The structure of the wiring substrate 10 in accordance with the above embodiment may be modified. For example, the wiring substrate 10 is not limited to any particular structure as long as it includes the wiring layer 32, the insulation layer 40, the through holes 50, the via wiring 50V, and the wiring layer 82. The wiring substrate 10 may be, for example, a core substrate or a coreless substrate.

The wiring substrate 10 of the above embodiment may be used in any type of package such as a chip size package (CSP) or a small outline non-lead package (SON).

CLAUSES

This disclosure encompasses the embodiments described below.

1. A method for manufacturing a wiring substrate, the method including:
   forming an insulation layer that covers the first wiring layer;
   forming a first through hole and a second through hole in the insulation layer, the first through hole exposing part of an upper surface of the first wiring layer, and the second through hole located adjacent to the first through hole and exposing part of the upper surface of the first wiring layer;
   forming a communication hole through which a bottom portion of the first through hole and a bottom portion of the second through hole are in communication;
   forming a via wiring that fills the first through hole, the second through hole, and the communication hole; and
   forming a second wiring layer integrally with the via wiring on an upper surface of the insulation layer.

2. The method according to clause 1, where:
   the forming a first through hole and a second through hole includes forming the first through hole and the second through hole through laser drilling;
   the forming a communication hole includes
      widening the bottom portion of the first through hole and the bottom portion of the second through hole through a first desmearing process, and
      further widening the bottom portion of the first through hole and the bottom portion of the second through hole through a second desmearing process that differs from the first desmearing process.

3. The method according to clause 1, further including:
   forming a recessed portion in an upper surface of the first wiring layer exposed by the first through hole, the second through hole, and the communication hole after forming the communication hole and before forming the via wiring and the second wiring layer; and
   the via wiring being formed so as to fill the recessed portion.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A wiring substrate, comprising:
   a first wiring layer;
   an insulation layer covering an upper surface of the first wiring layer;
   a first through hole extending through the insulation layer in a thickness-wise direction and exposing part of the upper surface of the first wiring layer;
   a second through hole located adjacent to the first through hole, the second through hole extending through the insulation layer in the thickness-wise direction and exposing part of the upper surface of the first wiring layer;

a communication hole through which a bottom portion of the first through hole is in communication with a bottom portion of the second through hole;
a via wiring that fills the first through hole, the second through hole, and the communication hole; and
a second wiring layer formed integrally with the via wiring on an upper surface of the insulation layer, wherein:
the first through hole includes
a first wall extending downward from the upper surface of the insulation layer, and
a first depression extending toward an outer side of the first through hole from the first wall;
the second through hole includes
a second wall extending downward from the upper surface of the insulation layer, and
a second depression extending toward an outer side of the second through hole from the second wall; and
part of the first depression is in communication with part of the second depression through the communication hole.

2. The wiring substrate according to claim 1, wherein the communication hole increases a width of the first through hole at the bottom portion of the first through hole and increases a width of the second through hole at the bottom portion of the second through hole.

3. The wiring substrate according to claim 1, wherein:
the communication hole extends through a lower portion of the insulation layer between the first through hole and the second through hole; and
the first through hole, the second through hole, and the communication hole form a via hole having a U-shaped cross section.

4. The wiring substrate according to claim 1, wherein:
the communication hole has a depth that is at a minimum at a middle position in a first direction in which the first through hole and the second through hole are arranged; and
the communication hole increases in depth from the middle position toward the first through hole in the first direction, and increases in depth from the middle position toward the second through hole in the first direction.

5. The wiring substrate according to claim 1, wherein:
the first depression extends continuously around an entirety of the first through hole in a circumferential direction of the first through hole;
the second depression extends continuously around an entirety of the second through hole in a circumferential direction of the second through hole; and
part of the first depression in the circumferential direction is in communication with part of the second depression in the circumferential direction through the communication hole.

6. The wiring substrate according to claim 1, wherein:
the first wiring layer includes
a first recessed portion located in the upper surface of the first wiring layer exposed by the first through hole, and
a second recessed portion located in the upper surface of the first wiring layer exposed by the second through hole;
the first recessed portion is in communication with the second recessed portion through the communication hole; and
the first recessed portion is continuous with the second recessed portion.

7. The wiring substrate according to claim 1, wherein the via wiring includes:
a seed layer covering a first wall of the first through hole, a second wall of the second through hole, a lower surface of the insulation layer that defines a wall of the communication hole, and an upper surface of the first wiring layer exposed by the first through hole, the second through hole, and the communication hole; and
a metal layer formed on the seed layer and filling the first through hole, the second through hole, and the communication hole.

8. A wiring substrate, comprising:
a first wiring layer;
an insulation layer covering an upper surface of the first wiring layer;
a first through hole extending through the insulation layer in a thickness-wise direction and exposing part of the upper surface of the first wiring layer;
a second through hole located adjacent to the first through hole, the second through hole extending through the insulation layer in the thickness-wise direction and exposing part of the upper surface of the first wiring layer;
a communication hole through which a bottom portion of the first through hole is in communication with a bottom portion of the second through hole;
a via wiring that fills the first through hole, the second through hole, and the communication hole; and
a second wiring layer formed integrally with the via wiring on an upper surface of the insulation layer,
wherein the via wiring includes:
a seed layer covering a first wall of the first through hole, a second wall of the second through hole, a lower surface of the insulation layer that defines a wall of the communication hole, and an upper surface of the first wiring layer exposed by the first through hole, the second through hole, and the communication hole; and
a metal layer formed on the seed layer and filling the first through hole, the second through hole, and the communication hole.

9. The wiring substrate according to claim 8, wherein the communication hole increases a width of the first through hole at the bottom portion of the first through hole and increases a width of the second through hole at the bottom portion of the second through hole.

10. The wiring substrate according to claim 8, wherein:
the communication hole extends through a lower portion of the insulation layer between the first through hole and the second through hole; and
the first through hole, the second through hole, and the communication hole form a via hole having a U-shaped cross section.

11. The wiring substrate according to claim 8, wherein:
the communication hole has a depth that is at a minimum at a middle position in a first direction in which the first through hole and the second through hole are arranged; and
the communication hole increases in depth from the middle position toward the first through hole in the first direction, and increases in depth from the middle position toward the second through hole in the first direction.

12. The wiring substrate according to claim 8, wherein:
the first wiring layer includes
a first recessed portion located in the upper surface of the first wiring layer exposed by the first through hole, and a second recessed portion located in the upper surface of the first wiring layer exposed by the second through hole;

the first recessed portion is in communication with the second recessed portion through the communication hole; and the first recessed portion is continuous with the second recessed portion.

* * * * *